(12) United States Patent
Hatoh et al.

(10) Patent No.: US 9,460,895 B2
(45) Date of Patent: Oct. 4, 2016

(54) GAS SUPPLY METHOD FOR SEMICONDUCTOR MANUFACTURING APPARATUS, GAS SUPPLY SYSTEM, AND SEMICONDUCTOR MANUFACTURING APPARATUS

(71) Applicant: Tokyo Electron Limited, Tokyo (JP)

(72) Inventors: Hideyuki Hatoh, Miyagi (JP); Hiroyuki Ogawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/377,898

(22) PCT Filed: Mar. 8, 2013

(86) PCT No.: PCT/JP2013/056525
§ 371 (c)(1),
(2) Date: Aug. 11, 2014

(87) PCT Pub. No.: WO2013/137152
PCT Pub. Date: Sep. 19, 2013

(65) Prior Publication Data
US 2014/0361102 A1 Dec. 11, 2014

(30) Foreign Application Priority Data
Mar. 16, 2012 (JP) .................. 2012-060636

(51) Int. Cl.
*H01L 21/302* (2006.01)
*H01L 21/461* (2006.01)
(Continued)

(52) U.S. Cl.
CPC ....... *H01J 37/3244* (2013.01); *H01L 21/3065* (2013.01); *H01L 21/30655* (2013.01); *H01L 21/76898* (2013.01); *H01L 22/26* (2013.01); *H01L 29/84* (2013.01); *Y10T 137/87684* (2015.04)

(58) Field of Classification Search
None
See application file for complete search history.

(56) References Cited

U.S. PATENT DOCUMENTS 4,579,623 A 4/1986 Suzuki et al.
2005/0241763 A1* 11/2005 Huang .............. C23C 16/45561
156/345.33

(Continued)

FOREIGN PATENT DOCUMENTS

| JP | H04-073287 | 11/1992 |
|---|---|---|
| JP | 2010-510669 | 4/2010 |
| WO | 2008/061069 | 5/2008 |

*Primary Examiner* — Stephanie Duclair
(74) *Attorney, Agent, or Firm* — IPUSA, PLLC

(57) ABSTRACT

A gas supply method includes controlling communication between first and second gas pipes and a diffusion chamber using first and second valves; controlling discharge of gas within the first and second gas pipes using third and fourth valves connected upstream from the first and second valves; and controlling communication between an exhaust pipe and the diffusion chamber using a fifth valve. The gas supply method further includes a first pressurization step of closing the first valve and the third valve before starting a first step and pressurizing a first gas within the first gas pipe; a second pressurization step of closing the second valve and the fourth valve before starting a second step and pressurizing a second gas within the second gas pipe; and an exhaust step of opening the fifth valve upon starting the first step and the second step, and discharging gas within the diffusion chamber.

11 Claims, 16 Drawing Sheets

(51) Int. Cl.
*G01R 31/00* (2006.01)
*G01L 21/30* (2006.01)
*C03C 15/00* (2006.01)
*C03C 25/68* (2006.01)
*C23F 1/00* (2006.01)
*B44C 1/22* (2006.01)
*H01J 37/32* (2006.01)
*H01L 29/84* (2006.01)
*H01L 21/66* (2006.01)
*H01L 21/3065* (2006.01)
*H01L 21/768* (2006.01)

(56) References Cited

U.S. PATENT DOCUMENTS

| | | | |
|---|---|---|---|
| 2008/0078505 A1* | 4/2008 | Kofuji | H01L 21/3065 156/345.33 |
| 2010/0058984 A1* | 3/2010 | Marubayashi | C23C 16/24 118/715 |
| 2011/0244686 A1* | 10/2011 | Aso | H01L 21/76898 438/694 |
| 2012/0037316 A1* | 2/2012 | Ogasawara | H01J 37/32091 156/345.51 |

\* cited by examiner

FIG.6A

| INNER DIAMETER (mm) | FLOW RATE (mol) | | FLOW RATE RATIO (CHAMBER SIDE) (%) | TIME (sec) |
| --- | --- | --- | --- | --- |
| | EXHAUST LINE SIDE | CHAMBER SIDE | | |
| NO EXHAUST | 0 | 0.000409 | 100 | 0.034 |
| 1/4 (INCH) PIPE ⌀4.3 | 0.000051 | 0.000358 | 88 | 0.031 |
| 3/8 (INCH) PIPE ⌀7.52 | 0.000235 | 0.000175 | 43 | 0.017 |
| 1/2 (INCH) PIPE ⌀10.4 | 0.000342 | 0.00007 | 17 | 0.009 |

| NO VALVE CONTROL | VALVE CONTROL |
|---|---|
| DEPOSITION STEP : 2sec<br>ETCHING STEP : 5sec | DEPOSITION STEP : 1sec<br>ETCHING STEP : 5sec<br>EXHAUST STEP : 0.5sec<br>PRESSURIZATION STEP : 1sec |
| <br>RESIST FILM<br>SILICON Si | <br>RESIST FILM<br>SILICON Si |
| Time 7:00<br>Depth 89.7 [μm]<br>Taper 87.3 [deg.]<br>E/R 12.8 [μm/m]<br>Sel 25.7 | Time 7:00<br>Depth 94.3 [μm]<br>Taper 87.0 [deg.]<br>E/R 13.5 [μm/m]<br>Sel 30.1 |

GAS SUPPLY METHOD FOR SEMICONDUCTOR MANUFACTURING APPARATUS, GAS SUPPLY SYSTEM, AND SEMICONDUCTOR MANUFACTURING APPARATUS

TECHNICAL FIELD

The present invention relates to a gas supply method for a semiconductor manufacturing apparatus, a gas supply system, and a semiconductor manufacturing apparatus.

BACKGROUND ART

In the field of semiconductor device manufacturing, techniques are in demand for increasing the density of semiconductor devices through microfabrication. For example, there is a demand for an etching process for forming a hole with a relatively small diameter of 10-20 μm at a depth of at least 100 μm on a silicon (Si) substrate.

Also, recently, attention is being directed to the so-called three-dimensional (3D) packaging technique that involves stacking semiconductor chips to increase the density per unit area of semiconductor devices. An example of the 3D packaging technique includes 3D circuitization, which involves establishing electrical connection between semiconductor chips stacked on each other using an electrode formed at a through hole (TSV: through-silicon via) penetrating through a semiconductor chip. An etching process for etching a deep hole penetrating through the semiconductor chip has to be performed in such case.

In the etching process as described above that may be implemented in a plasma etching apparatus, for example, a plasma processing method is known that involves temporarily and intermittently stopping the supply of $SF_6$ gas that encourages etching for a short period of time and forming a nitride film on a surface of a silicon substrate while the etching process is temporarily stopped in order to etch the silicon substrate without the occurrence of undercutting (see e.g. Patent Document 1).

However, in the case of forming a hole with a depth of at least 100 μm, plasma etching has to be performed for a long period of time. Also, in view of the recent demands for further miniaturization of semiconductor devices, holes with relatively small diameters of 10-20 μm have to be formed. With the demand for further miniaturization of the semiconductor devices, the thickness of a resist film has to be reduced in order to secure shape accuracy. Also, the etch rate of a silicon layer with respect to the etch rate of the resist layer; namely, the selectivity, may not be adequately high. Thus, when plasma etching is performed for a long period of time, a mask may be removed before the etching process is completed, for example.

In this respect, a plasma processing method is known that involves alternately repeating a deposition step of performing a plasma process on a substrate by supplying a gas having a high deposition gas content and an etching step of performing a plasma process on the substrate by supplying gas with a high etching gas content (see e.g. Patent Document 2).

In a plasma process that involves repeatedly performing a deposition step and an etching step as described above, the selectivity of the substrate with respect to the resist film may be higher compared to the case of performing a normal plasma etching process, and a desired etching shape may be efficiently formed while maintaining a relatively high etch rate.

PRIOR ART DOCUMENTS

Patent Documents

Patent Document 1: Japanese Examined Patent Publication No. H04-73287
Patent Document 2: PCT Japanese Translation Patent Publication No. 2010-510669

SUMMARY OF THE INVENTION

Problem to be Solved by the Invention

However, in the conventional plasma process that involves repeatedly performing a deposition step and an etching step as described above, a gas to be used in a next step is introduced while discharging a gas used in a previous step immediately preceding the next step at a switch timing for switching between the deposition step and the etching step. That is, gas is introduced into a chamber after passing through a gas supply pipe and being diffused at a diffusion chamber. Thus, when the two steps are switched from one to the other, a processing gas used in a previous step remains within the diffusion chamber and is mixed with a processing gas to be used in the next step that is newly introduced into the diffusion chamber. As a result, variations occur in the component ratios of the processing gases. Particularly, the amount of residual gas of a previous process remaining in the diffusion chamber varies depending on process conditions such as the pressure within a processing chamber, for example. Thus, it may be difficult to set the component ratio of the processing gas for each step to a predetermination gas component ratio at an initial stage right after switching from one step to the other and desired etching results may not be obtained.

In light of the above, an aspect of the present invention relates to additionally performing a step of controlling the pressure of a processing gas within a gas supply pipe in a plasma process of repeatedly performing a deposition step and an etching step to thereby provide a gas supply method for a semiconductor manufacturing apparatus, a gas supply system, and a semiconductor manufacturing apparatus that are capable of preventing the mixing of residual gas components remaining in the gas supply pipe from a previous step with a processing gas that is newly supplied for a next step.

Means for Solving the Problem

According to one embodiment of the present invention, a gas supply method is provided for a semiconductor manufacturing apparatus that alternately repeats a first step of performing a plasma process on a workpiece by supplying a first gas into a chamber via a first gas pipe and a diffusion chamber, and a second step of performing a plasma process on the workpiece by supplying a second gas into the chamber via a second gas supply pipe and the diffusion chamber. The gas supply method involves controlling communication between the first gas pipe and a diffusion chamber using a first valve, controlling communication between the second gas pipe and the diffusion chamber using a second valve, controlling discharge of gas within the first gas pipe using a third valve connected upstream from the first valve of the first gas pipe, controlling discharge of gas within the second gas pipe using a fourth valve connected upstream from the second valve of the second gas pipe, and controlling communication between an exhaust pipe and the diffusion chamber using a fifth valve. The gas supply method further includes a first pressurization step of closing the first valve and closing the third valve before starting the first step, and increasing a pressure within the first gas pipe by the first gas; a second pressurization step of closing the second valve and closing the fourth valve before starting the second step, and increasing a pressure within the second gas pipe by the second gas; and an exhaust step of opening the fifth valve in response to a start of the first step and a start of the second step, and discharging gas within the diffusion chamber.

According to another embodiment of the present invention, a gas supply system is provided for a semiconductor manufacturing apparatus that alternately repeats a first step of performing a plasma process on a workpiece by supplying a first gas into a chamber via a first gas pipe and a diffusion chamber, and a second step of performing a plasma process on the workpiece by supplying a second gas into the chamber via a second gas supply pipe and the diffusion chamber. The gas supply system includes a first valve configured to control communication between the first gas pipe and a diffusion chamber, a second valve configured to control communication between the second gas pipe and the diffusion chamber, a third valve connected upstream from the first valve of the first gas pipe and configured to control discharge of gas within the first gas pipe, a fourth valve connected upstream from the second valve of the second gas pipe and configured to control discharge of gas within the second gas pipe, and a fifth valve configured to control communication between an exhaust pipe and the diffusion chamber. The gas supply system further includes a first gas supply mechanism configured to close the first valve and close the third valve before starting the first step, and increase a pressure within the first gas pipe by the first gas; a second gas supply mechanism configured to close the second valve and close the fourth valve before starting the second step, and increase a pressure within the second gas pipe by the second gas; and an exhaust mechanism configured to open the fifth valve in response to a start of the first step and a start of the second step, and discharge gas within the diffusion chamber.

According to another embodiment of the present invention, a semiconductor manufacturing apparatus is provided that performs a plasma process on the workpiece using the gas supply system according to an embodiment of the present invention.

Advantageous Effect of the Invention

According to an aspect of the present invention, by additionally performing a step of controlling the pressure of a processing gas within a gas supply pipe (pressurization step and exhaust step) in a plasma process of repeatedly performing a deposition step and an etching step, residual gas components remaining in the gas supply pipe from a previous step may be prevented from mixing with a processing gas newly supplied for a next step, and the switch time for switching processing gases of the steps may be reduced.

BRIEF DESCRIPTION OF THE DRAWINGS

FIG. 6A is a table illustrating a relationship between a pipe diameter and the discharge of gas in the gas supply system according to an embodiment of the present invention;

EMBODIMENTS FOR IMPLEMENTING THE INVENTION

Figure 1:
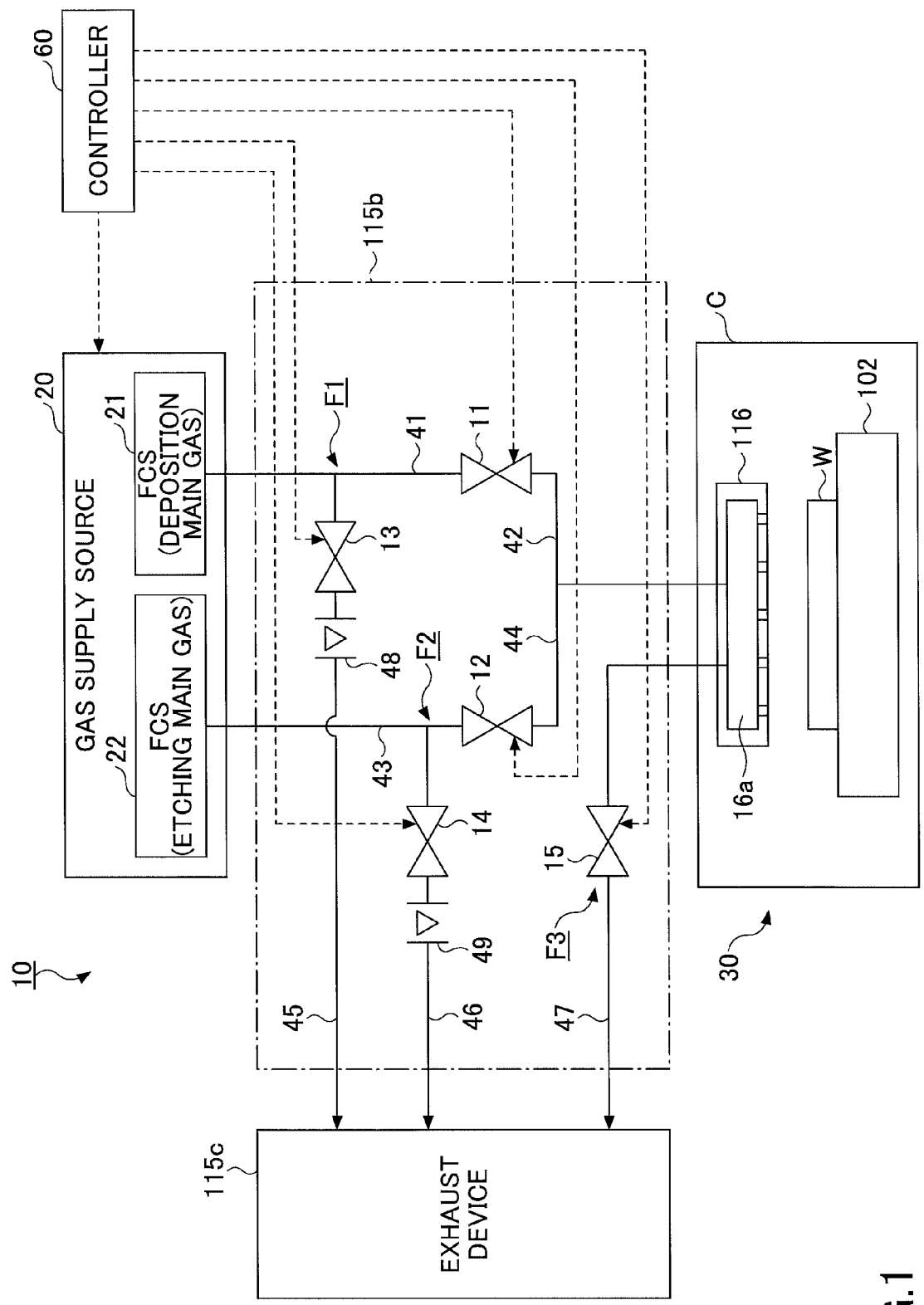
FIG. 1 illustrates an overall configuration of a gas supply system according to an embodiment of the present invention.

In the following, embodiments of the present invention are described with reference to the accompanying drawings. Note that in the following descriptions and the accompanying drawings, elements having substantially the same functional features are referred to by the same reference numerals and overlapping descriptions thereof may be omitted.

Also, note that a pressure of 1 Torr may be converted into 133.322 Pa.

<Introduction>

Figure 15:
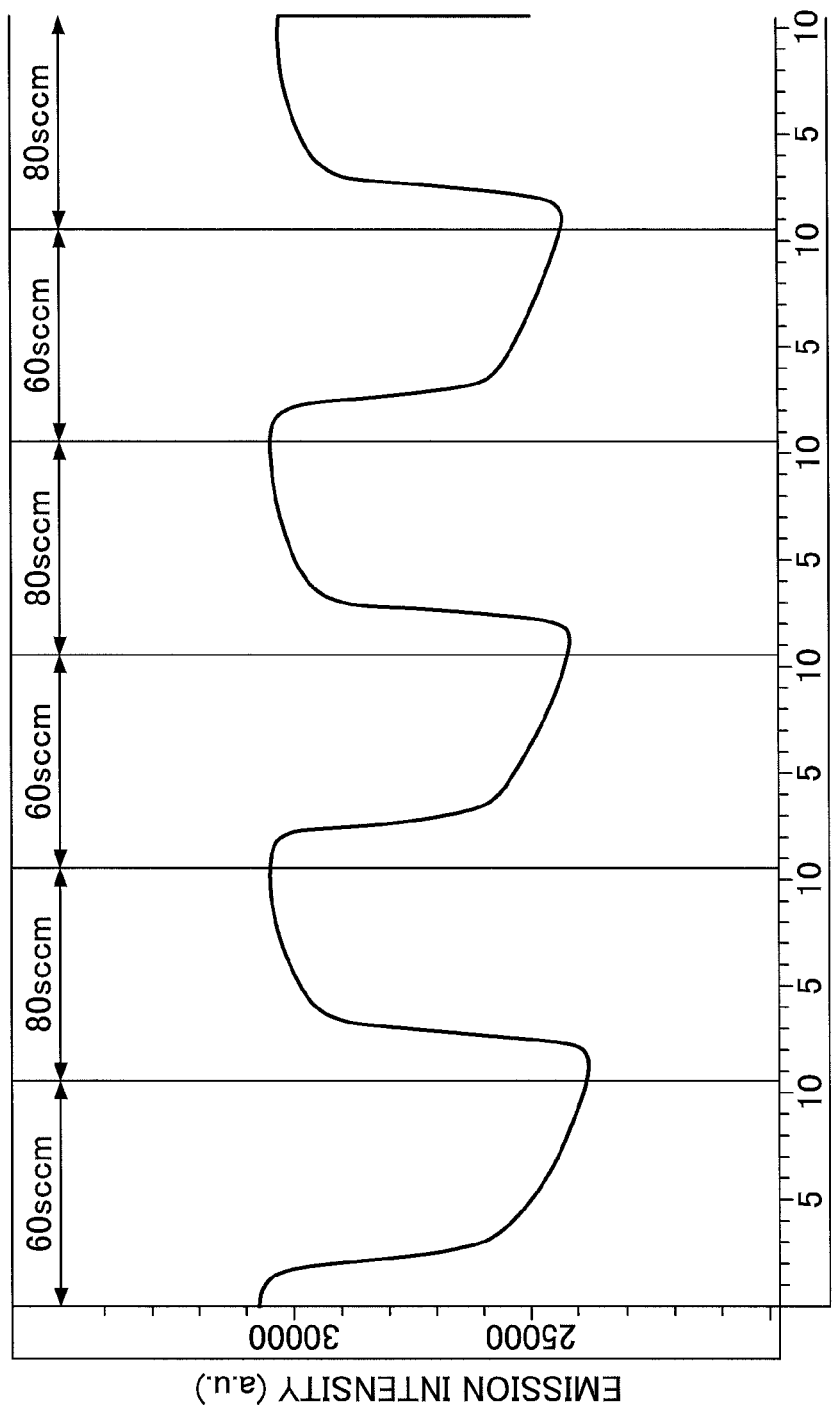
FIG. 15 is a graph illustrating an exemplary plasma emission intensity in the plasma process of repeatedly performing a deposition step and an etching step according to an embodiment of the present invention.
Figure 16:
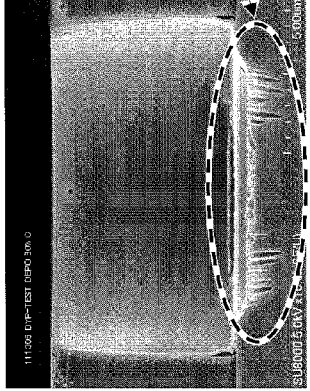
FIG. 16 illustrates exemplary etching results of the plasma process of repeatedly performing a deposition step and an etching step according to an embodiment of the present invention.

In the following, a plasma process of repeatedly performing a deposition step and an etching step according to an embodiment of the present invention is described with reference to FIGS. 15 and 16. FIG. 15 is a graph illustrating an exemplary plasma emission intensity in a plasma process of repeatedly performing a deposition step and an etching step according to an embodiment of the present invention. FIG. 16 illustrates an exemplary etching result of the plasma process of repeatedly performing a deposition step and an etching step according to an embodiment of the present invention.

In the exemplary plasma process of repeatedly performing a deposition step and an etching step as illustrated in FIG. 15, a deposition step of introducing a gas containing a greater proportion of a deposition gas compared to an etching gas and an etching step of introducing a gas containing a greater proportion of the etching gas compared to the deposition gas are alternately performed at approximately 10-second-intervals. Also, in the process of repeatedly performing the deposition step and the etching step as illustrated in FIG. 15, a transition point from the deposition step to the etching step or vice versa and a change point of the plasma emission intensity are intentionally shifted from each other. That is, plasma generation conditions are controlled such that even when the process transitions from the deposition step to the etching step, the plasma emission intensity of the deposition step is maintained a while longer, for example. Similarly, plasma generation conditions are controlled such that even when the process transitions from the etching step to the deposition step, the plasma emission intensity of the etching step is maintained a while longer, for example. In this way, various transient states of plasma may be intentionally created, for example.

On the other hand, in the plasma process of repeatedly performing a deposition step and an etching step for obtaining the etching result as illustrated in FIG. 16 and in a plasma process of repeatedly performing a deposition step and an etching step according to an embodiment of the present invention as described below, the switch timings of the plasma emission intensity are arranged to match the switch timings of the deposition step and the etching step.

In the following, the exemplary etching results of implementing the plasma process of repeatedly performing a deposition step and an etching step according to an embodiment of the present invention as illustrated in FIG. 16 are described. In the present embodiment, the plasma process of repeatedly performing a deposition step and an etching step is performed under the following process conditions.

Process Conditions

| Pressure | 250 (mTorr) |
|---|---|
| High Frequency Power | Plasma generation HF: 2500 (W) |
| | Biasing LF: 0 (W) |
| Deposition main gas | $SiF_4/O_2$ = 1000/500 (sccm) |
| Etching main gas | $Ar/SF_6$ = 640/860 (sccm) |
| Process step time | 1 (min) |

FIG. 16 illustrates etching results obtained by implementing the plasma process of repeatedly performing a deposition step and an etching step under the above process conditions using gas mixtures with differing mixture ratios A and B. Referring to the left side of FIG. 16, the mixture ratio A represents a case where the gas mixture is 91% deposition gas (film deposition gas) and 9% etching gas. Upon implementing the plasma process of repeatedly performing a deposition step and an etching step in this case, a protective film having an adequate film thickness of 0.873 μm was formed.

On the other hand, referring to the right side of FIG. 16, the mixture ratio B represents a case where the gas mixture is 80% deposition gas (film deposition gas) and 20% etching gas. Upon implementing the plasma process of repeatedly performing a deposition step and an etching step in this case, the film thickness of the protective film was 0.446 μm. That is, when the deposition gas ratio was reduced from 91% to 80%, the film thickness of the resulting protective film was reduced by approximately 45%.

Also, as can be appreciated from the micrographs of FIG. 16, in the case of using the gas mixture ratio A as illustrated on the left side of FIG. 16, the bottom of a hole may be arranged to have a desired shape, whereas in the case of using the gas mixture ratio B as illustrated on the right side of FIG. 16, etching tends to progress at the bottom of the hole. Based on the above, it can be appreciated that when the plasma process of repeatedly performing a deposition step and an etching step is implemented using a gas mixture ratio of 80% deposition gas (film deposition gas) and 20% etching gas, the film thickness of a film may be too thin to adequately serve its function as a protective film.

Further, when the plasma process of repeatedly performing a deposition step and an etching step is implemented using the gas mixture ratio of 80% deposition gas (film deposition gas) and 20% etching gas, the etch rate may be no more than 3 μm/min indicating a degradation in etching performance.

Based on the foregoing, etching performance may be improved and a desirable etching shape may presumably be obtained by a gas supply method that can reduce the switch time for switching between the above two steps and prevent the mixing of the processing gases of the above two steps as much as possible. In a gas supply system according to an embodiment of the present invention described below, the following features (1)-(3) are implemented in order to reduce the switch time for switching between the above two steps.

(1) A gas supply line is provided as a path from a gas supply source to a diffusion chamber, the gas supply line including a first gas supply mechanism for supplying a deposition main gas (first gas containing a deposition gas at a higher ratio than an etching gas) into a chamber and a second gas supply mechanism for supplying an etching main gas (second gas containing the etching gas at a higher ratio than the deposition gas) into the chamber. By dividing the gas supply line into a plurality of gas supply lines in the manner described above and minimizing the volume of the gas diffusion chamber at which the above gases may mix with one another, mixing between a supply gas and a residual gas from a previous step may be reduced upon switching from one step to the other step.

(2) A valve controlled by a controller is arranged at each gas supply line, and a pipeline pressure of the gas supply line is controlled by opening/closing the valve. The valve is closed before gas is supplied to the chamber, and the pipeline pressure of the gas supply line is increased to create a pressure gradient with respect to the pressure within the chamber. In this way, when the gas supply line is switched; namely, when the valve is opened, gas may be quickly transported into the diffusion chamber of the gas chamber owing to the pressure gradient. Also, residual gas from a previous step remaining within the diffusion chamber may be pushed out at this point.

(3) Further, an exhaust line is provided for efficiently exchanging the residual gas from the previous step remaining within the diffusion chamber.

In a gas supply system according to an embodiment of the present invention that implements the above features (1)-(3), gases used in the deposition step and the etching step in the process of repeatedly performing the above two steps may hardly be mixed with one another upon switching between the steps. In this way, a film deposition process for forming a protective film and an etching process may be efficiently performed in the deposition step and the etching step, respectively, and the performance of the deposition step and the performance of the etching step may be improved. Also, the cycle length of the plasma process of repeatedly performing the deposition step and the etching step may be shortened, the etch rate and the selectivity of a silicon substrate with respect to a resist film may be increased, and a desirable etching shape may be obtained. In the following, the gas supply system according to an embodiment of the present invention is described in greater detail.

[Overall Configuration of Gas Supply System]

First, an overall configuration of the gas supply system according to an embodiment of the present invention is described with reference to FIG. 1.

The gas supply system 10 according to the present embodiment is used by a semiconductor manufacturing apparatus 30. The semiconductor manufacturing apparatus 30 executes a plasma process of alternately performing a deposition step and an etching step a predetermined number of times. The deposition step involves supplying a deposition main gas containing a deposition gas at a higher ratio than an etching gas (first gas) into a chamber C through a diffusion chamber 16a and performing a plasma process on a silicon substrate W. The etching step involves supplying an etching main gas containing the etching gas at a higher ratio compared to the deposition gas (second gas) into the chamber C through the diffusion chamber 16a and performing a plasma process on the silicon substrate W. In this way, for example, a desired deep hole may be formed on the silicon substrate W that is mounted on a mounting table 102. In the present embodiment, the deposition main gas is a gas mixture containing $SiF_4$ gas and $O_2$ gas. Further, in the present embodiment, the etching main gas is a gas mixture containing $SF_6$ gas and $O_2$ gas.

The gas supply system 10 according to the present embodiment includes a gas adjustment unit 115b. The gas adjustment unit 115b is connected to a gas supply source 20, the semiconductor manufacturing apparatus 30, a controller 60, and an exhaust device 115c.

The gas adjustment unit 115b includes a first gas supply mechanism F1 as a gas supply line for the deposition step and a second gas supply mechanism F2 as a gas supply line for the etching step. The deposition main gas is supplied to the chamber C in the deposition step by the first gas supply mechanism F1. Also, the etching main gas is supplied to the chamber C in the etching step by the second gas supply mechanism F2. The gas adjustment unit 115b alternately supplies the deposition main gas and the etching main gas from the gas supply source 20 to the semiconductor manufacturing apparatus 30 at predetermined timings. The gas adjustment unit 115b also includes an exhaust mechanism F3 as a gas exhaust line in addition to the first gas supply mechanism F1 and the second gas supply mechanism F2.

The first gas supply mechanism F1 includes a first gas supply pipe 41, a first gas introducing pipe 42, and a first valve 11. The first gas supply pipe 41 is a pipe for supplying the deposition main gas that is controlled to a predetermined flow rate by a flow control system (FCS) 21 arranged at the gas supply source 20. A first bypass pipe 45 is connected to the first gas supply pipe 41 via a third valve 13. The first bypass pipe 45 bypasses the deposition main gas and discharges the deposition main gas. An orifice 48 is arranged at the first bypass pipe 45. By narrowing the gas flow path in the first bypass pipe 45 with the orifice 48, an abrupt pressure change within the first bypass pipe 45 may be avoided when switching between the etching step and the deposition step. Also, note that by controlling the pressure within the first bypass pipe 45 to be relatively high, pressure fluctuations within the first bypass 45 before and after executing a first pressurization step (described below) may be avoided.

The deposition step is executed while the first valve 11 is open. The deposition main gas passes through the first gas supply pipe 41, flows through the first gas introducing pipe 42, and is introduced into the chamber C via the diffusion chamber 16a arranged at a gas shower head 116 of the chamber C. When the first valve 11 is closed, normally, the third valve 13 is controlled to open, and the deposition main gas is discharged by the exhaust device 115c via the first bypass pipe 45. Examples of the exhaust device 115c include a dry pump and a turbo molecular pump (TMP).

In the first pressurization step, the third valve 13, which is arranged at the first bypass pipe 45 for bypassing the deposition main gas before the deposition step, is closed, and the deposition main gas is accumulated in the first gas supply pipe 41 for supplying the deposition main gas to the chamber C. In this way, the pressure within the first gas supply pipe 41 is increased in the first pressurization step.

Figure 2:
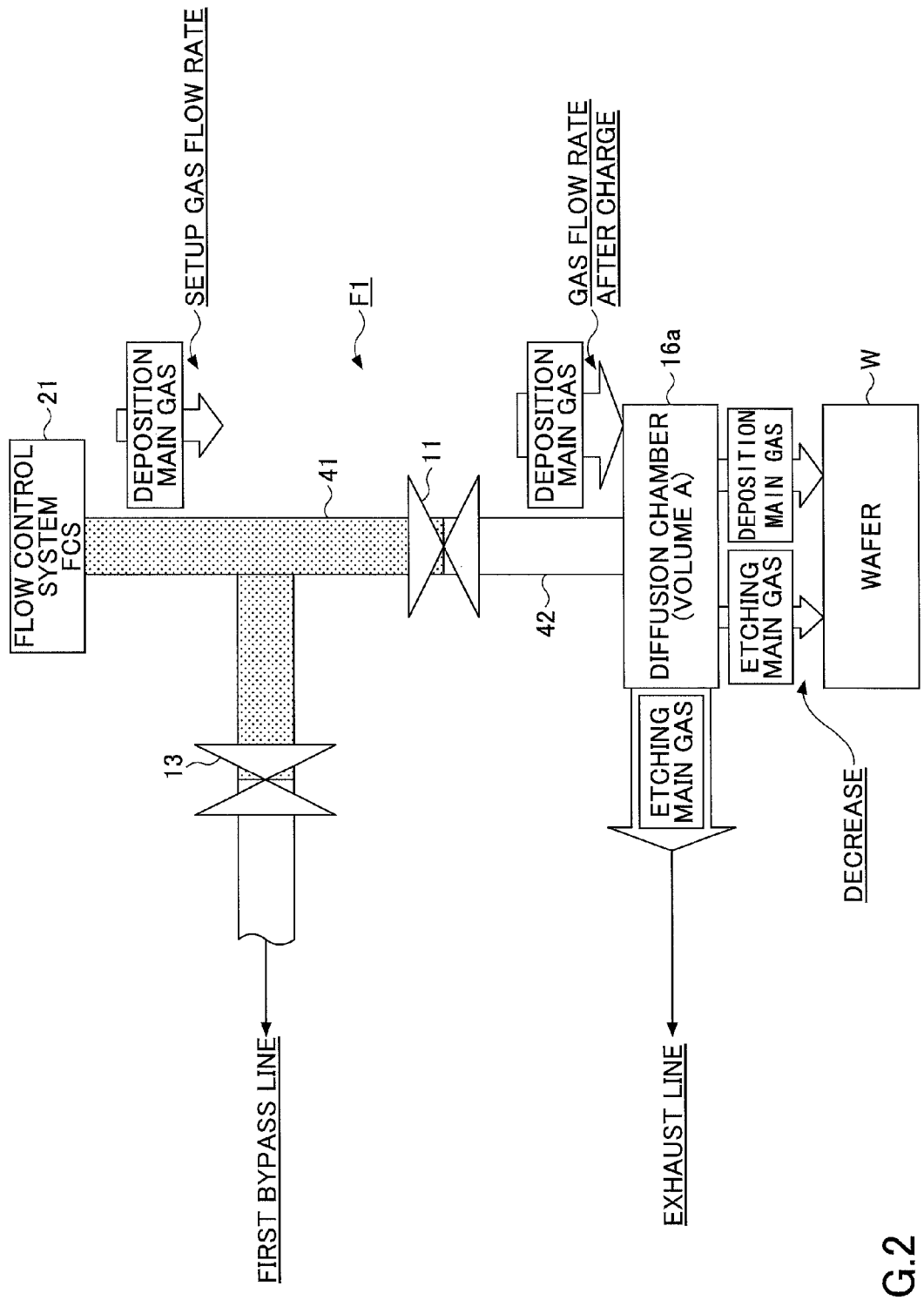
FIG. 2 illustrates a gas flow of the gas supply system according to an embodiment of the present invention.

Normally, before the first pressurization step, the first valve 11 arranged at the first gas introducing pipe 42 is closed. At this time, a second valve 12 is opened, and the etching step is executed. In the first pressurization step, the first valve 11 is controlled to close and the third valve 13 is controlled to close before starting a deposition step, and the deposition main gas supplied from the gas supply source 20 is accumulated within the first gas supply pipe 41. In this way, the pressure within the first gas supply pipe 41 is increased (see FIG. 2). In this state, when the first valve 11 is controlled to open at the time the etching step is switched to the deposition step, the deposition main gas accumulated within the first gas supply pipe 41 flows all at once into the diffusion chamber 16a.

The second gas supply mechanism F2 includes a second gas supply pipe 43, a second gas introducing pipe 44, and the second valve 12.

The second gas supply pipe 43 is a pipe for supplying the etching main gas that is controlled to a predetermined flow rate by a flow control system (FCS) 22 arranged at the gas supply source 20. A second bypass pipe 46 is connected to the second gas supply pipe 43 via a fourth valve 14. The second bypass pipe 46 bypasses the etching main gas to discharge the etching main gas during the deposition step. An orifice 49 is arranged at the second bypass pipe 46. By narrowing the gas flow path in the second bypass pipe 46, abrupt pressure changes within the second bypass pipe 46 may be avoided at the time of switching between the etching step and the deposition step. Also, by controlling the pressure within the second bypass pipe 46 to be relatively high, pressure fluctuations within the second bypass pipe 46 before and after a second pressurization step (described below) may be reduced.

The etching step is executed while the second valve 12 is open. The etching main gas passes through the second gas supply pipe 43, flows through the second gas introducing pipe 44, and is introduced into the chamber C via the diffusion chamber 16*a*. Normally, when the second valve 12 is closed, the fourth valve 14 is controlled to open, and as a result, the etching main gas is discharged by the exhaust device 115*c* via the second bypass pipe 46.

In the second pressurization step, the fourth valve 14, which is arranged at the second bypass pipe 46 for bypassing the etching main gas before the etching step, is closed, and the etching main gas is accumulated in the second gas supply pipe 43 for supplying the etching main gas to the chamber C. In this way, the pressure within the second gas supply pipe 43 is increased in the second pressurization step.

Normally, before the second pressurization step, the second valve 12 arranged at the second gas introducing pipe 44 is closed. In this case, the first valve 11 is open, and the deposition step is executed. In the second pressurization step, the second valve 12 is controlled to close and the fourth valve 14 is controlled to close before starting the etching step, and the etching main gas supplied from the gas supply source 20 is accumulated in the second gas supply pipe 43. In this way, the pressure within the second gas supply pipe 43 is increased. In this state, when the second valve 12 is controlled to open at the time the deposition step is switched to the etching step, the etching main gas accumulated at the second gas supply pipe 43 flows all at once into the diffusion chamber 16*a*.

The exhaust mechanism F3 includes an exhaust pipe 47 communicating with the diffusion chamber 16*a*, and a fifth valve 15 arranged at the exhaust pipe 47. The fifth valve 15 of the exhaust mechanism F3 is controlled to open upon switching steps in the plasma process of repeatedly performing a deposition step and an etching step. In this way, gas of a previous step remaining in the diffusion chamber 16*a* may be forcefully discharged (exhaust step).

The controller 60 includes a CPU (not shown) and is configured to control the type of gas output from the gas supply source 20, the gas flow rate, and the opening/closing operations of the first through fifth valves 11-15 according to the switch timings for switching between the deposition step and the etching step. In the gas supply system 10 according to the present embodiment, computerized control of the opening/closing operations of the first through fifth valves 11-15 may be executed by the controller 60. Note that an exemplary configuration of the semiconductor manufacturing apparatus 30 is described below with reference to FIG. 12.

As described above, in the gas supply system 10 according to the present embodiment, a pressurization step and an exhaust step are additionally performed in the plasma process of alternately performing a deposition step and an etching step. In the pressurization step, the third valve 13 or the fourth valve 14 is closed before the switch timing of switching between the deposition step and the etching step. In this way, gas to be used in a next step may be accumulated in the first gas supply pipe 41 or the second gas supply pipe 43 until the switch timing of the steps. In turn, when the steps are switched, the gas accumulated in the first gas supply pipe 41 or the second gas supply pipe 43 may flow into the diffusion chamber 16*a* at high speed. In the exhaust step, the fifth valve 15 of the exhaust line is opened upon switching the steps. In this way, gas from a previous step residing in the gas shower head 116 may be forced out. According to an aspect of the present embodiment, by executing the pressurization step and the exhaust step upon switching between the deposition step and the etching step, gas within the diffusion chamber 16*a* may be promptly exchanged and the switch time required for switching gases may be reduced. As a result, mixing of the gases used in the two steps may hardly occur when the steps are switched. In this way, selectivity may be increased while maintaining a high etch rate, and a desirable etching shape may be efficiently obtained.

[Gas Supply System Operations]

Figure 3:
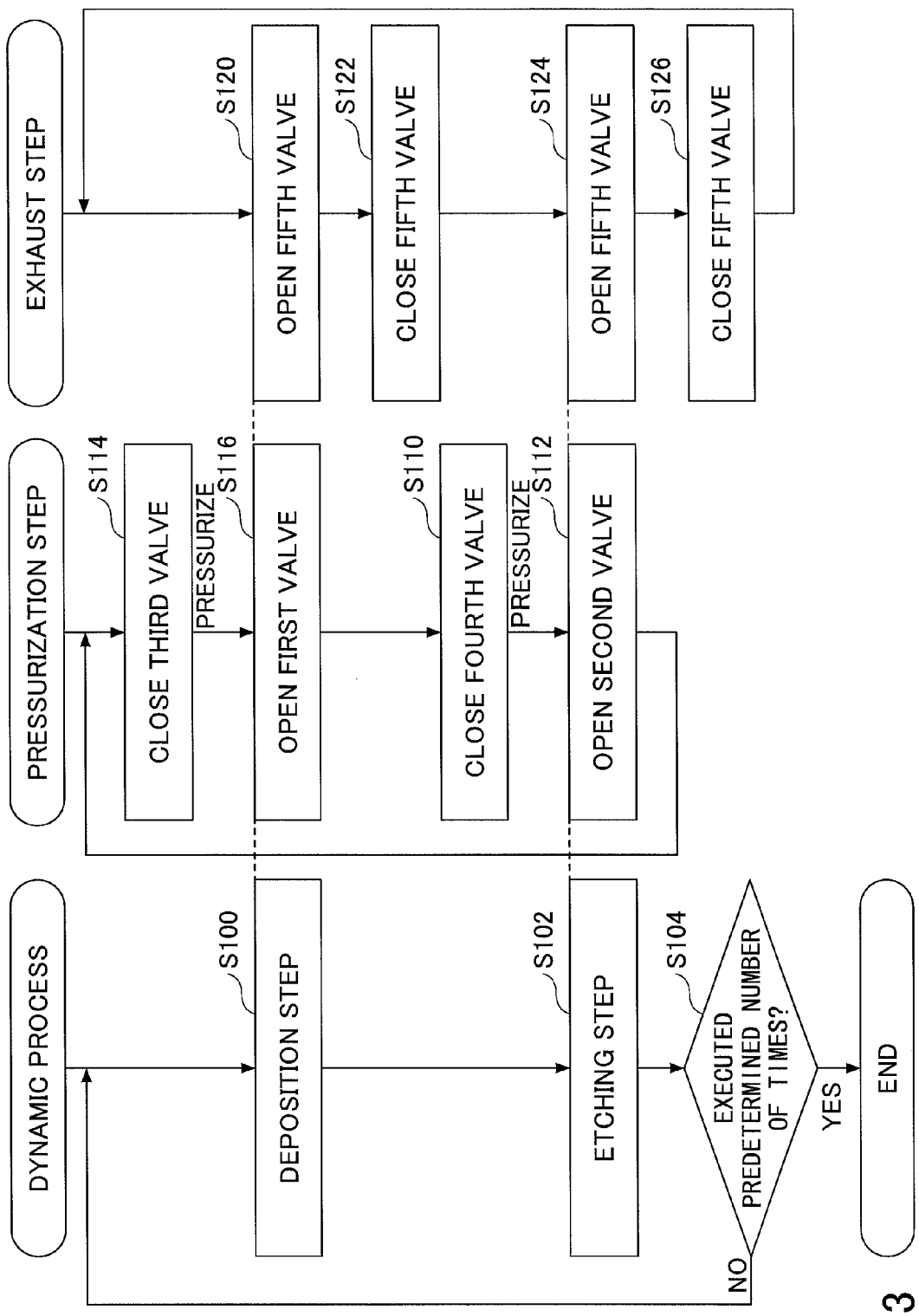
FIG. 3 is a flowchart illustrating a plasma process of repeatedly performing a deposition step and an etching step using the gas supply system according to an embodiment of the present invention.
Figure 4:
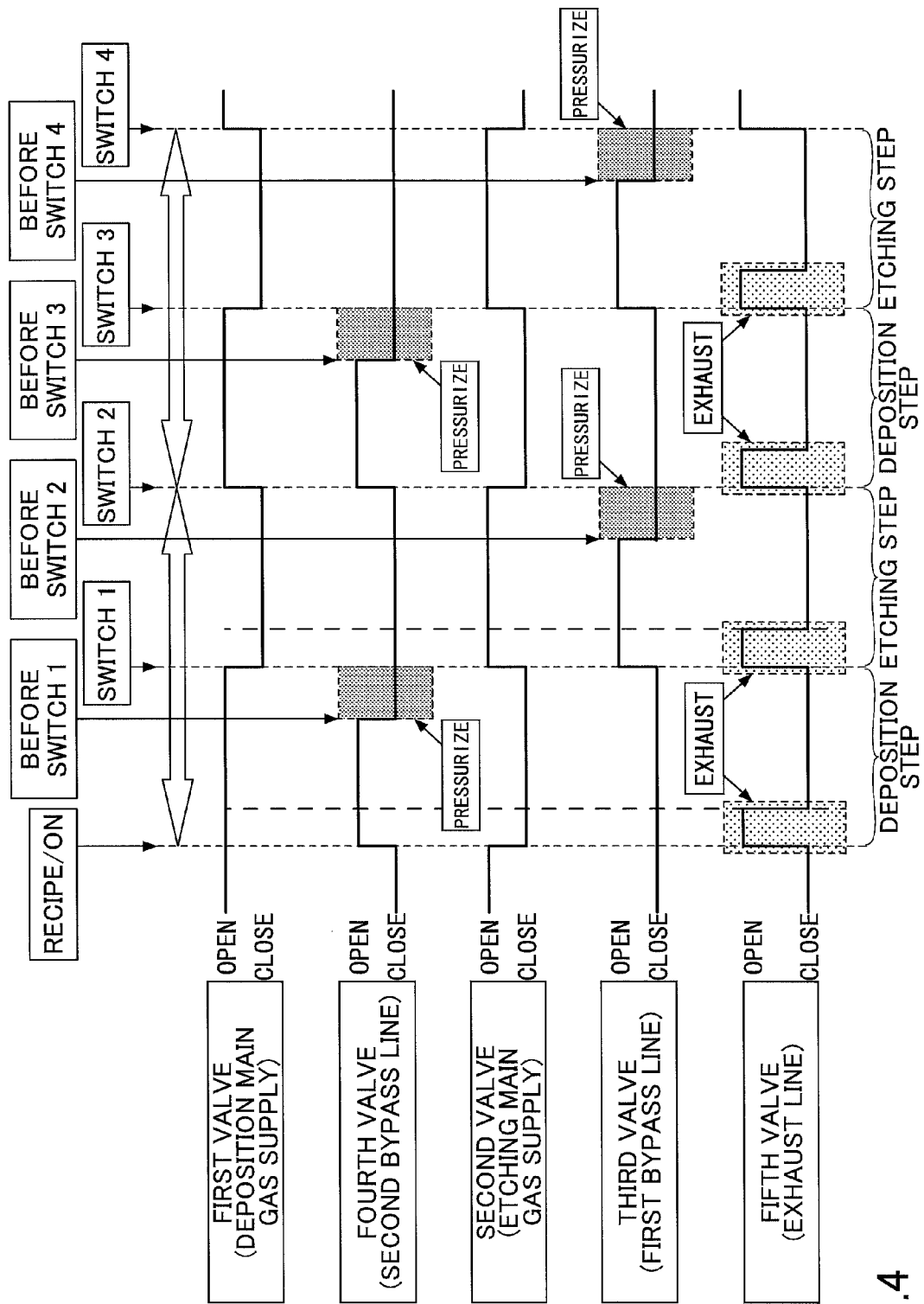
FIG. 4 is a sequence chart illustrating the plasma process of repeatedly performing a deposition step and an etching step using the gas supply system according to an embodiment of the present invention.

In the following, operations of a gas supply system according to an embodiment of the present invention are described with reference to FIGS. 3 and 4. FIG. 3 is a flowchart illustrating an exemplary plasma process of repeatedly performing a deposition step and an etching step using a gas supply system according to an embodiment of the present invention. FIG. 4 is a sequence chart illustrating the plasma process of repeatedly performing a deposition step and an etching step using the gas supply system according the present embodiment. The controller 60 is configured to control operations illustrated in the flowchart such as switching gases and opening/closing the valves according to recipes stored in a storage unit such as a ROM or a RAM, for example.

When the process of repeating the deposition step and the etching step according to the present embodiment is started, the controller 60 executes the deposition step (step S100). Note that in some embodiments, the etching step may be executed before the deposition step of step S100. The timing at which the deposition step of step S100 is executed corresponds to the timing represented as "RECIPE/ON" in FIG. 4. At this time, the first valve 11 is open, the second valve 12 is closed, the third valve 13 is closed, and the fourth valve 14 is open. In this way, the deposition main gas may pass through the first gas supply pipe 41, flow through the first gas introducing pipe 42, and be introduced into the chamber C via the diffusion chamber 16*a* arranged at the gas shower head 116 of the chamber C (see FIG. 1).

Also, at this timing, the fifth valve 15 is switched from a closed state to an open state (step S120), and after a predetermined exhaust time period elapses, the fifth valve 15 is switched from the open state back to the closed state (step S122). In this way, a gas from a previous step remaining in the diffusion chamber 16*a* is forced out (exhaust step).

The controller 60 switches the fourth valve 14 from an open state to a closed state (step S110: second pressurization step) at a predetermined timing before executing the etching step (step S102). Note that the above predetermined timing corresponds to the timing represented as "BEFORE SWITCH 1" in FIG. 4. Accordingly, before executing the etching step, the second valve 12 is controlled to close and the fourth valve 14 is controlled to close. In this way, the etching main gas supplied from the gas supply source 20 may be accumulated in the second gas supply pipe 43, and the pressure within the second gas supply pipe 43 may be increased.

After a predetermined deposition time period elapses, the controller 60 executes the etching step (step S102). This timing corresponds to the timing represented as "SWITCH 1" in FIG. 4. In this way, the deposition step is switched to the etching step. At this time, the second valve 12 is switched from a closed state to an open state (step S112), and the first valve 11 is controlled to close. In this way, the supply of the deposition main gas is stopped, and the etching main gas accumulated in the second gas supply pipe 43 flows into the diffusion chamber 16a all at once. In this way, the gas atmosphere within the diffusion chamber 16a may be instantaneously changed from the deposition main gas to the etching main gas. Thus, the gas switching time may be reduced and the mixing of the gas used in a previous step and the gas used in a next step may be avoided.

Further, at the "SWITCH 1" timing, the fifth valve 15 is switched from a closed state to an open state (step S124), and after a predetermined exhaust time period elapses, the fifth valve 15 is switched from the open state back to the closed state (step S126). In this way, gas from a previous step remaining within the diffusion chamber 16a (deposition main gas in the present case) is forced out. Also, at the "SWITCH 1" timing, the third valve 13 is switched from a closed state to an open state. In this way, the deposition main gas within the first gas supply pipe 41 may be discharged from the first bypass pipe 45.

Next, the controller 60 determines whether the deposition step and the etching step have been executed a predetermined number of times (step S104). If the two steps have been executed the predetermined number of times, the present process is ended. If the two steps have not yet been executed the predetermined number of times, the process goes back to step S100. In this case, the controller 60 switches steps from the etching step to the deposition step after a predetermined etching time period elapses, and executes the deposition step (step S100). Note, however, that before switching the steps, the controller 60 switches the third valve 13 from an open state to a closed state (step S114: first pressurization step). The timing at which the third valve 13 is switched from the open state to the closed state corresponds to the timing represented as "BEFORE SWITCH 2" in FIG. 4. In this way, before executing the deposition step, the first valve 11 is controlled to close and the third valve 13 is controlled to close. Thus, the deposition main gas supplied from the gas supply source 20 may be accumulated in the first gas supply pipe 41, and the pressure within the first gas supply pipe 41 may be increased.

Next, the controller 60 executes the deposition step (step S100). This timing corresponds to the timing represented as "SWITCH 2" in FIG. 4. In this way, the process may be switched from the etching step to the deposition step. At this time, the first valve 11 is switched from a closed state to an open state (step S116), and the second valve 12 is controlled to close. In this way, the supply of the etching main gas is stopped, and the deposition main gas within the first gas supply pipe 41 flows into the diffusion chamber 16a all at once. As a result, the gas atmosphere in the diffusion chamber 16a is instantaneously changed from the etching main gas to the deposition main gas. In this way, the gas switch time may be reduced and the mixing of the gas used in a previous step and the gas used in a next step may be avoided.

Further, at the "SWITCH 2" timing, the fifth valve 15 is switched from a closed state to an open state (step S120), and after a predetermined exhaust time period elapses, the fifth valve 15 is switched from the open state back to the closed state (step S122). In this way, gas from a previous step (etching main gas in the present case) remaining in the diffusion chamber 16a may be forced out. Also, at the "SWITCH 2" timing, the fourth valve 14 is switched from a closed state to an open state. In this way, the etching main gas in the second gas supply pipe 43 may be discharged from the second bypass pipe 46.

As described above, when the process of repeatedly performing a deposition step and an etching step is implemented in the gas supply system 10 according to the present embodiment, mixing of the gases used in the two steps may be substantially prevented upon switching between the two steps. In this way, a film deposition process for forming a protective film and an etching process may be efficiently performed in the deposition step and the etching step, respectively, and performance may be improved in the deposition step and the etching step.

[Start of Pressurization Step and Pressure Fluctuations]

In the gas supply system 10 according to the present embodiment, the pressurization step is implemented before switching the gases for the two steps. In the following, the start of the pressurization step and pressure fluctuations are described. Note that the flow path system of the second gas supply mechanism F2 connected to the flow control system (FCS) 22 is substantially identical to the flow path system of the first gas supply mechanism F1 connected to the FCS 21. Accordingly, in the following, the pressurization step executed in the flow path system of the first gas supply mechanism F1 and pressure fluctuations occurring therein are described, and descriptions of the pressurization step and pressure fluctuations in the flow path system of the second gas supply mechanism F2 are omitted. Also, in the following descriptions, the number of moles (mol) is used to calculate pressure fluctuations. The number of moles is expressed by mass/molar mass and does not depend on the gas type. Thus, the number of moles can be used to describe pressure fluctuations with respect to differing gas mixtures.

Figure 5:
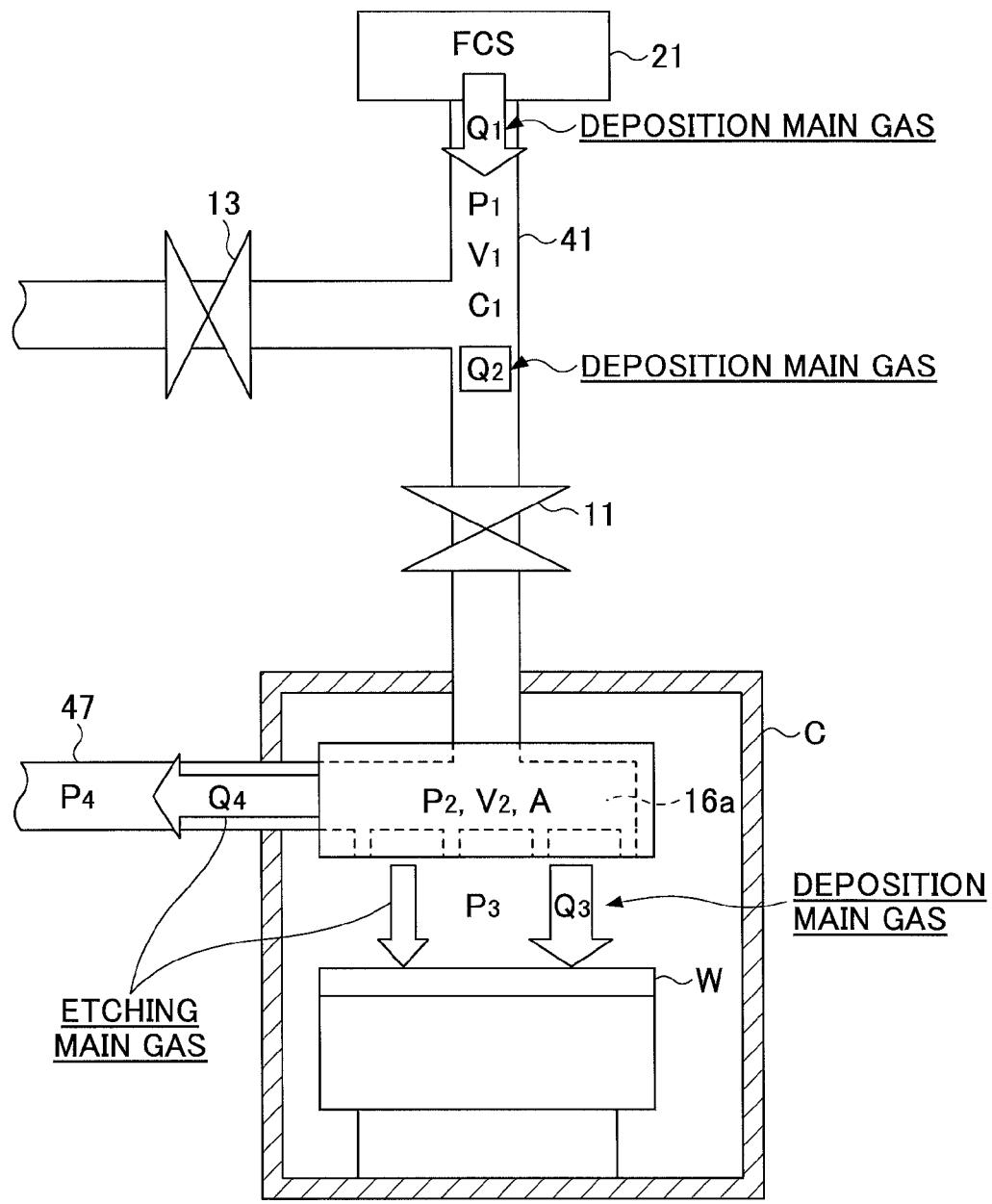
FIG. 5 illustrates variables indicating states within the gas supply system according to an embodiment of the present invention.

As illustrated in FIG. 5, when the third valve 13 is open, the number of moles $n_1$ within the first gas supply pipe 41 may be calculated based on the following state equation.

$$n_1 = P_1 V_1 / RT$$

Note that in the above state equation, $P_1$ represents the pressure and $V_1$ represents the volume within the first gas supply pipe 41.

Also, assuming $Q_1$ represents the gas flow rate of gas output from the FCS 21 (1000 sccm), the total number of moles $n_2$ within the first gas supply pipe 41 after a certain time t (seconds) elapses from the time the third valve 13 is closed and the pressurization step is started is equal to the sum of a value obtained by multiplying by time t the number of moles of the gas flowing into the first gas supply pipe 41 from the FCS 21 at the gas flow rate $Q_1$ and the number of moles $n_1$ already existing within the first gas supply pipe 41. That is, the total number of moles $n_2$ within the first gas supply pipe 41 t seconds after the start of the pressurization step may be represented by the following equation (1).

$$n_2 = Q_1/RT \times t + P_1 V_1/RT \tag{1}$$

Accordingly, the pressure $P_2$ within the first gas supply pipe 41 t seconds after the start of the pressurization step may be calculated using the above equation (1) and the above state equation ($n_1 = P_1 V_1 / RT$) as represented by the following equation (2).

$$P_2 = Q_1/V_1 \times t + P_1 \tag{2}$$

[Pressure After Opening Switch Valve]

Next, after switching gases, the number of moles required for exchanging gases within a volume A of the diffusion chamber 16a is calculated. If the required number of moles can be stored within the first gas supply pipe 41 during the pressurization step, the gas within the diffusion chamber 16a may be instantaneously switched from the gas type used in a previous step to the gas type used in the next step upon switching between the two steps.

First, in a case where the flow of gas within the first gas supply pipe 41 corresponds to a viscous flow, the Hagen- Poiseuille law applies. The flow rate Q in this case may be represented by the following equation.

$$Q=(5.236\times10^{-4}/\eta)\times(a^4/l)\times P_u(P_{u2}-P_{u1})(\text{mTorr}\cdot l/\text{sec})$$

where $P_u=(P_{u2}+P_{u1})/2$

Note that in the above equation, $P_{u1}$ represents the pressure (mTorr) at the pipe outlet, $P_{u2}$ represents the pressure (mTorr) at the pipe inlet, and $P_u$ represents the average pressure (mTorr). Also, "a" represents the pipe radius, "l" represents the pipe length, and "η" represents the viscosity coefficient (poise, dyn/sec·cm²) of the gas at the time at a given temperature of the pipe. For example, with respect to air at 25° C., $\eta_{25}=1.845\times10^{-4}$.

Based on the Hagen-Poiseuille law, after the first valve 11 of FIG. 4 corresponding to a switch valve is opened, the following equation (3) representing a time change in the flow of fluid applies within the first gas supply pipe 41.

$$V_1 dP_1/dt=-C_1(P_2^2-P_1^2)+Q_1 \quad (3)$$

In the above equation (3), $P_1$ represents the pressure within the first gas supply pipe 41 and $V_1$ represents the volume within the first gas supply pipe 41. Also, $C_1$ represents the conductance within the first gas supply pipe 41, $P_2$ represents the pressure within the diffusion chamber 16a, and $Q_1$ represents the gas flow rate of gas flowing in from the FCS 21. The above equation (3) represents the state of gas flowing into/out of the first gas supply pipe 41 after the first valve 11 is opened.

Similarly, based on the Hagen-Poiseuille law, after the first valve 11 is opened, the following equation (4) applies within the diffusion chamber 16a.

$$V_2 dP_2/dt=C_1(P_2^2-P_1^2)-Q_3-Q_4 \quad (4)$$

Note that in the above equation (4), $P_2$ represents the pressure within the diffusion chamber 16a and $V_2$ represents the volume within the diffusion chamber 16a. Also, $C_1$ represents the conductance within the first gas supply pipe 41, and $P_1$ represents the pressure within the first gas supply pipe 41. Further, $Q_3$ represents the gas flow rate of gas flowing from the diffusion chamber 16a into the chamber C, and $Q_4$ represents the gas flow rate of gas flowing out toward the atmosphere via the exhaust pipe 47. The above state equation (4) represents the state of gas flowing into/out of the diffusion chamber 16a after the first valve 11 is opened.

Based on the above equation (3), the time change in the pressure within the first gas supply pipe 41 may be represented by the following equation (5).

$$dP_1/dt=-C_1(P_2^2-P_1^2)/V_1+Q_1/V_1 \quad (5)$$

Also, based on the above equation (4), the time change in the pressure within the diffusion chamber 16a may be represented by the following equation (6).

$$dP_2/dt=C_1(P_2^2-P_1^2)/V_2-C_2(P_2^2-P_3^2)/V_2-C_3(P_2^2-P_4^2)/V_2 \quad (6)$$

Note that in the above equation (6), $P_3$ represents the pressure within the chamber C, and $P_4$ represents the pressure at the exhaust line side.

By solving the equation (5) representing the time change $dP_1/dt$ in the pressure within the first gas supply pipe 41 and the equation (6) representing the time change $dP_2/dt$ in the pressure within the diffusion chamber 16a, the number of moles flowing into the diffusion chamber 16a and the number of moles flowing out of the diffusion chamber 16a may be calculated. When the sum of the number of moles flowing out toward the exhaust line side and the number of moles flowing out toward the chamber C reaches the volume A of the diffusion chamber 16a, the same number of moles of gas may be controlled to flow from the first gas supply pipe 41 into the diffusion chamber 16a. At this point, the switch from the gas used in the previous step to the gas used in the next step may be completed.

By actually solving the equations (5) and (6), the following results may be obtained.

The time it takes for the total number of moles within the diffusion chamber 16a to flow out of the diffusion chamber 16a is calculated to be 0.017 seconds. That is, in 0.017 seconds, all the gas within the diffusion chamber 16a may flow out of the diffusion chamber 16a, and the switch from the gas used in the previous step to the gas used in the next step may be completed. The above calculation result indicates that the gas within the diffusion chamber 16a may be switched almost instantaneously.

Note that upon switching between the two steps, the amount of residual gas flowing from the diffusion chamber 16a to the chamber C is desirably reduced to a minimum, and the amount of the residual gas flowing from the diffusion chamber 16a to the exhaust line side is desirably increased. In the present example, the total number of moles within the diffusion chamber 16a is 0.000409 mol. Referring to FIG. 6A, in a case where a ⅜ (inch) diameter pipe with an inner diameter of ϕ7.52 (mm) is used for the exhaust line, the total number of moles that flow from the diffusion chamber 16a into the chamber C is 0.000175 mol (in 0.017 seconds), and the total number of moles that flow from the diffusion chamber 16a toward the exhaust line is 0.000235 mol (in 0.017 seconds). Based on the above, it can be appreciated that approximately 43% of the residual gas within the diffusion chamber 16a flows into the chamber C.

In a case where a ¼ (inch) diameter pipe with an inner diameter of ϕ4.3 (mm) is used, the total number of moles that flow from the diffusion chamber 16a into the chamber C is 0.000358 mol (in 0.031 seconds), and the total number of moles that flow from the diffusion chamber 16a toward the exhaust line is 0.000051 mol (in 0.031 seconds). The results indicate that approximately 88% of the residual gas within the diffusion chamber 16a flows into the chamber C, which results are worse than the case where the ⅜ (inch) diameter pipe is used.

On the other hand, in a case where a ½ (inch) diameter pipe with an inner diameter of ϕ10.4 (mm) is used, the total number of moles that flow from the diffusion chamber 16a into the chamber C is 0.00007 mol (in 0.009 seconds), and the total number of moles that flow from the diffusion chamber 16a toward the exhaust line is 0.000342 mol (in 0.009 seconds). The results indicate that approximately 17% of the residual gas within the diffusion chamber 16a flows into the chamber C, which results are better than the cases where the ⅜ (inch) diameter pipe and the ¼ (inch) diameter pipe are used.

Figure 6B:
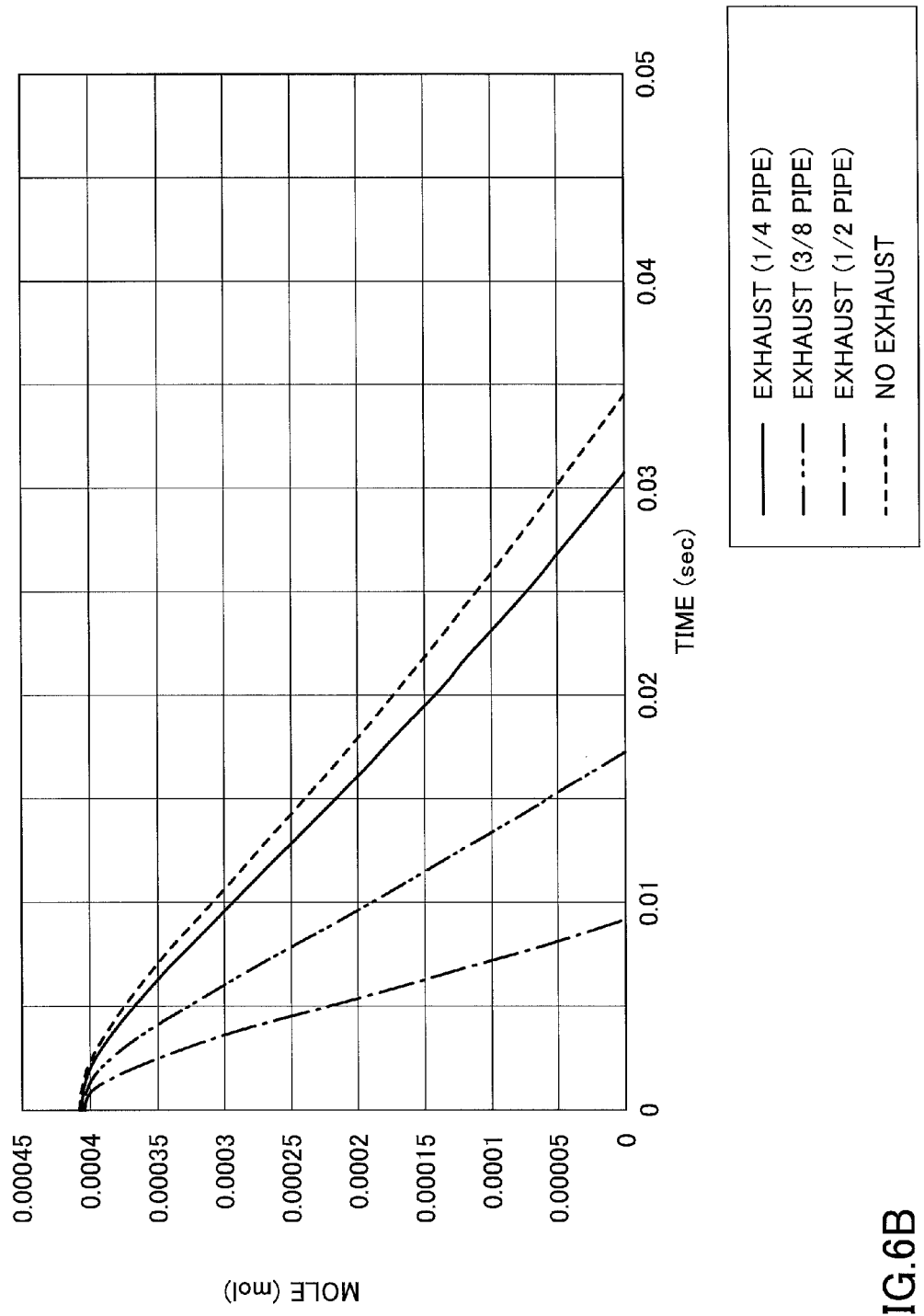
FIG. 6B is a graph illustrating the relationship between the pipe diameter and the discharge of gas in the gas supply system according to an embodiment of the present invention.

Also, the referring to FIG. 6B, it can be appreciated that the switch time may be reduced when the exhaust step is implemented in comparison to a case where the exhaust step is not implemented. Further, upon comparing the cases using pipes with differing diameters, it can be appreciated that the switch time may be reduced to a shortest time period when the ½ (inch) diameter pipe is used.

Note that a setup flow rate of a first gas is 1000 sccm. This means that 0.000693 moles flow out from the FCS 21 every second. That is, 0.000011781 moles flow out of the FCS 21 in 0.017 seconds, which corresponds to the time it takes for all the gas remaining within the diffusion chamber 16a to flow outside the diffusion chamber 16a.

Note that in a conventional system having no exhaust line, 100% of the residual gas within the diffusion chamber 16a flows into the chamber C. Such a system may produce undesirable effects as described above.

[Pressure of Diffusion Chamber After Opening Switch Valve]

Figure 7:
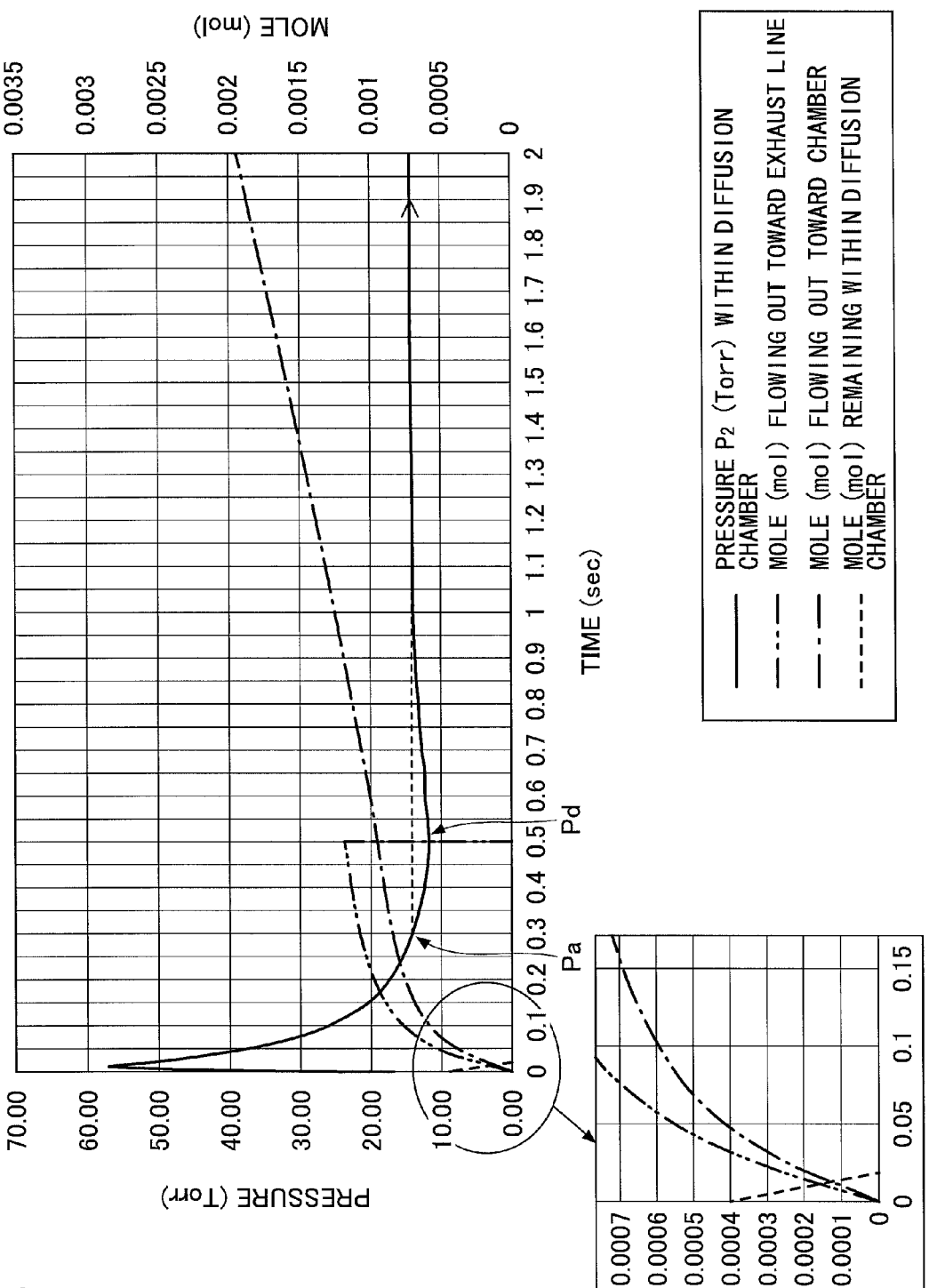
FIG. 7 illustrates a pressure within a diffusion chamber, a molar flow rate of gas flowing toward an exhaust line, and a molar flow rate of gas flowing toward a chamber after switching steps in the gas supply system according to an embodiment of the present invention.

In the present embodiment, before switching between the deposition step and the etching step, the pressurization step is implemented to increase the pressure within the first gas supply pipe 41 (and similarly, the second gas supply pipe 43). As a result, the moment the first valve 11 is opened, the deposition main gas flows from the first gas supply pipe 41, which is at a high pressure, into the diffusion chamber 16a, which is at a low pressure. As a result, the pressure within the diffusion chamber 16a is increased. Thus, measures are desirably implemented to promptly decrease the pressure within the diffusion chamber 16a to a normal pressure at which gas flows within the diffusion chamber 16a under normal circumstances so that the flow rate of gas being introduced from the diffusion chamber 16a to the chamber C may be stabilized. In this way, effective plasma control may be enabled. FIG. 7 illustrates a line graph representing the pressure $P_2$ (Torr) within the diffusion chamber 16a after the first valve 11 is opened in response to switching, a line graph representing the flow rate in moles of gas flowing toward the exhaust line, a line graph representing the flow rate in moles of gas being introduced toward the chamber C, and a line graph representing the flow rate in moles of gas remaining within the diffusion chamber 16a.

Based on FIG. 7, it can be anticipated that the pressure within the diffusion chamber 16a may be promptly decreased to normal pressure by enlarging the pipe diameter of the exhaust line to thereby increase the number of moles flowing toward the exhaust line.

However, when the pipe diameter of the exhaust line is too large, too much gas may be discharged and the pressure within the diffusion chamber 16a may once fall too low as illustrated by position Pd in FIG. 7. On the other hand, when the pipe diameter of the exhaust line is too small, it may take a long time for the pressure within the diffusion chamber 16a to be reduced to normal pressure. Thus, while discharging gas in the exhaust step, once the pressure within the diffusion chamber 16a falls to normal pressure (position Pa in FIG. 7; at 0.3 seconds in the present example), the fifth valve 15 of the exhaust line is closed. In this way, an excessive pressure decrease in the diffusion chamber 16a as illustrated by position Pd in FIG. 7 may be avoided and the pressure within the diffusion chamber 16a may be promptly decreased to normal pressure and stabilized. Note that as illustrated in the enlarged partial view of the graph of FIG. 7, the number of moles remaining within the diffusion chamber 16a may be reduced to 0 (zero) in approximately 3/100 seconds.

[Evaluation Results]

Figure 8:
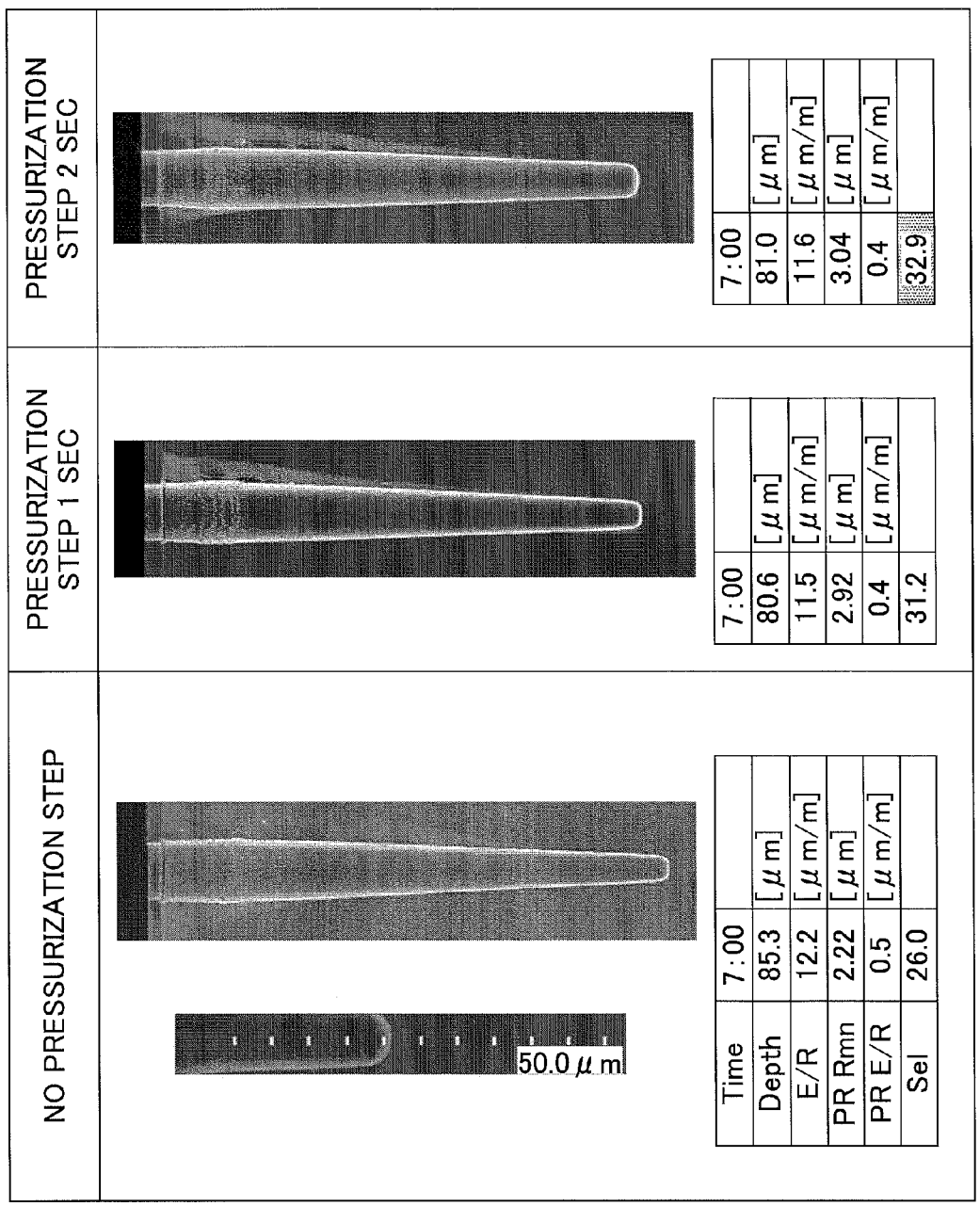
FIG. 8 illustrates experimental results of implementing a pressurization step according an embodiment of the present invention.
Figure 9:
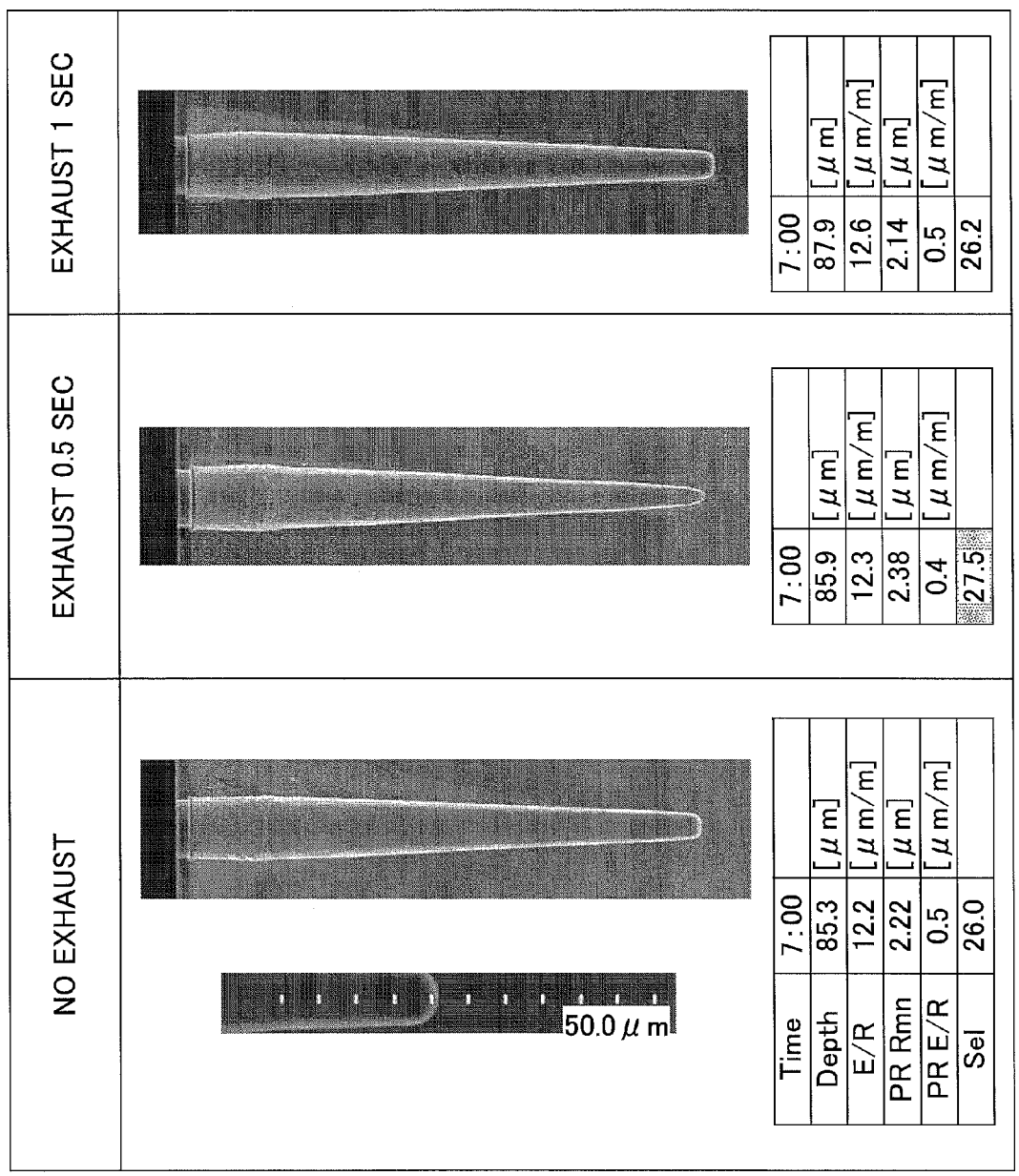
FIG. 9 illustrates experimental results of implementing an exhaust step according an embodiment of the present invention.
Figure 10:
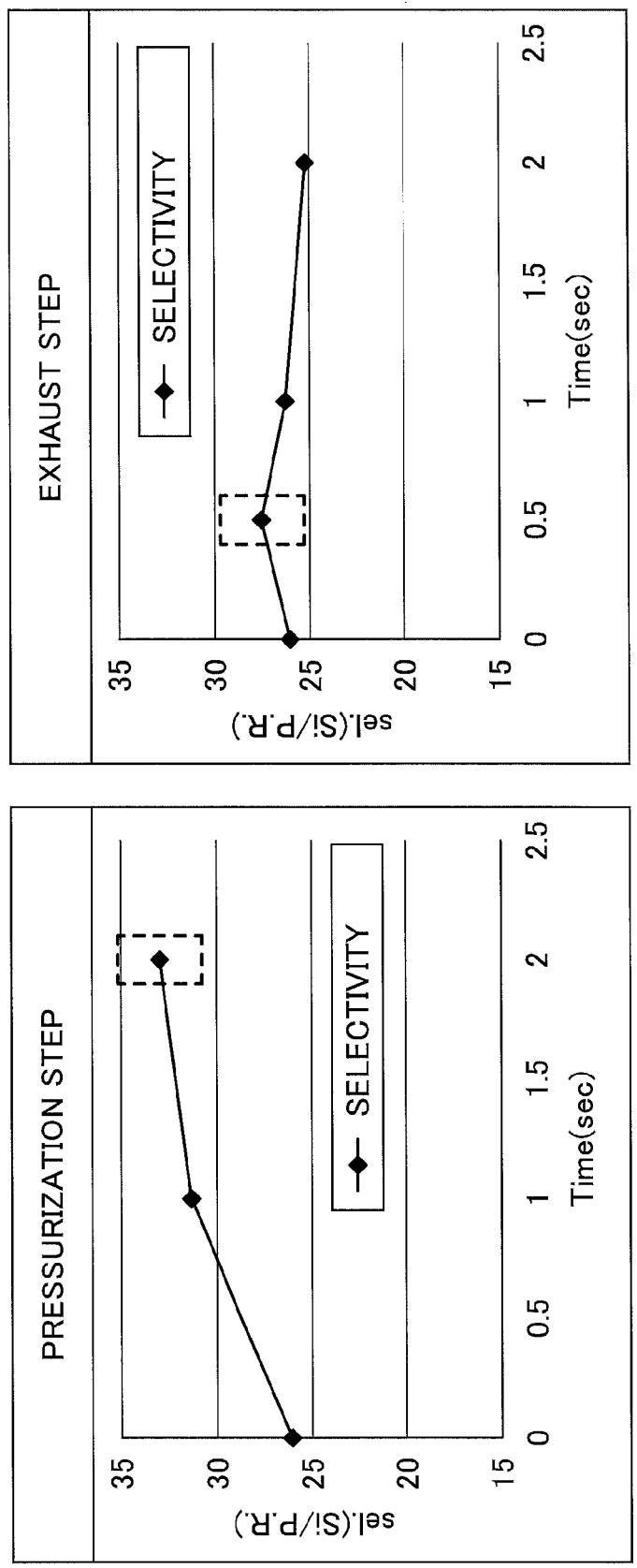
FIG. 10 is a graphical representation of the experimental results of implementing the pressurization step and the exhaust step according to an embodiment of the present invention.
Figure 11:
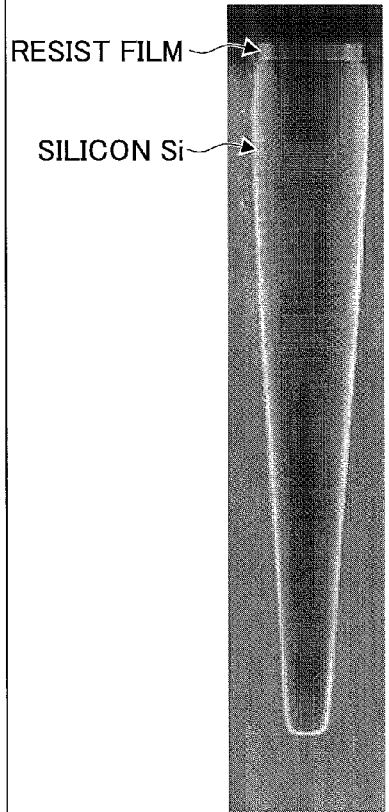
FIG. 11 illustrates experimental results of implementing a plasma process of repeatedly performing a deposition step and an etching step according to an embodiment of the present invention.
Figure 11:
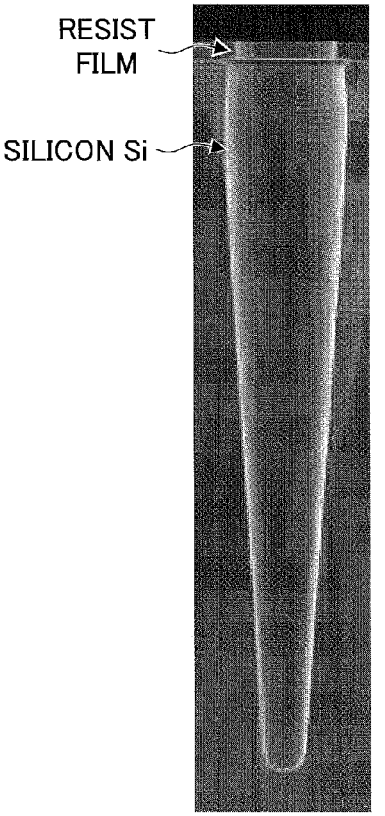

In the following, experimental results of implementing a plasma process of repeatedly performing a deposition step and an etching step in the gas supply system 10 according to an embodiment of the present invention are described with reference to FIGS. 8-11. FIG. 8 illustrates experimental results of implementing the pressurization step according to the present embodiment. FIG. 9 illustrates experimental results of implementing the exhaust step according to the present embodiment. FIG. 10 is a graphical representation of the experimental results of FIGS. 8 and 9. FIG. 11 illustrates experimental results of additionally performing a pressurization step and an exhaust step in a plasma process of repeatedly performing a deposition step and an etching step and according to the present embodiment.

(Pressurization Evaluation/FIG. 8)

First, effects of additionally performing the pressurization step according to the present embodiment during the plasma process of repeatedly performing a deposition step and an etching step are described. FIG. 8 illustrates differences in the etching results of deep holes depending on whether the pressurization step of the present embodiment is implemented during the plasma process of repeatedly performing a deposition step and an etching step under the following process conditions. Note that the left side of FIG. 8 illustrates a case where the pressurization step was not implemented, the center of FIG. 8 illustrates a case where the pressurization step was implemented for 1 second, and the right side of FIG. 8 illustrates a case where the pressurization step was implemented for 2 seconds. The process conditions used in the plasma process of the present experiment are indicated below.

1. Deposition Step

| | |
|---|---|
| Pressure | 200 (mTorr) |
| High Frequency Power | Plasma Generation HF: 2500 (W) |
| | Biasing LF: 0 (W) |
| Deposition Gas | $SiF_4/O_2$ = 400/300 (sccm) |
| Temperature | 20° C. |
| Process Step Time | 0.02 (min) |

2. Etching Step

| | |
|---|---|
| Pressure | 200 (mTorr) |
| High Frequency Power | Plasma Generation HF: 2500 (W) |
| | Biasing LF: 0 (W) |
| Deposition Gas | $O_2/SF_6$ = 100/600 (sccm) |
| Temperature | 20° C. |
| Process Step Time | 0.05 (min) |

Also, in the present experiment, a photoresist film having an opening with diameter of 10 μm and a film thickness of 5.5 μm was used to form a deep hole on a silicon substrate.

The experimental results illustrated in FIG. 8 indicate that when the pressurization step is performed for 1 second or 2 seconds, the selectivity (sel) of the silicon substrate with respect to the resist film may be improved compared to the case where the pressurization step is not performed.

(Exhaust Step Evaluation/FIG. 9)

Next, the effects of additionally performing the exhaust step according to the present embodiment during the plasma process of repeatedly performing a deposition step and an etching step are described. FIG. 9 illustrates differences in the etching results of deep holes depending on whether the exhaust step of the present embodiment is implemented during the plasma process of repeatedly performing a deposition step and an etching step under the above process conditions. Note that the left side of FIG. 9 illustrates a case where the exhaust step was not implemented, the center of FIG. 9 illustrates a case where the exhaust step was implemented for 0.5 seconds, and the right side of FIG. 9 illustrates a case where the exhaust step was implemented for 1 second.

The experimental results illustrated in FIG. 9 indicate that when the exhaust step is performed for 0.5 seconds or 1 second, the selectivity (sel) of the silicon substrate with respect to the resist film may be improved compared to the case where the exhaust step is not performed.

Referring to the graphs of FIG. 10 representing the experimental results of FIGS. 8 and 9, it can be appreciated that in terms of improving (increasing) the selectivity, pressurization is preferably performed for a period of 1-2 seconds in the pressurization step (see left side of FIG. 10), and exhaust gas is preferably discharged for a period of approximately 0.5 seconds in the exhaust step (see right side of FIG. 10).

Based on these results, it can be appreciated that both the pressurization step and the exhaust step have effects of reducing the switch time for switching gases within the diffusion chamber 16a and thereby improving the performance of the deposition step for forming a protective film. In this way, a desired protective film may be formed in the deposition step and the amount of resist film removed in the etching step may be reduced to improve the selectivity.

(Pressurization Step+Exhaust Step Evaluation/FIG. 11)

Next, the effects of additionally performing the pressurization step and the exhaust step of the present embodiment in the plasma process of repeatedly performing a deposition step and an etching step are described. FIG. 11 illustrates differences in the etching results of deep holes depending on whether the pressurization step and the exhaust step are implemented during the plasma process of repeatedly performing a deposition step and an etching step under the above process conditions. Note that the left side of FIG. 11 illustrates a case where no valve control was implemented (i.e., no pressurization step and exhaust step), and the right side of FIG. 11 illustrates a case where valve control (i.e., pressurization step and exhaust step) was implemented. The process step times of each of the above steps executed in the present experiment are indicated below.

No Valve Control (No Pressurization Step and Exhaust Step)

| Deposition Step | 2 seconds |
| Etching Step | 5 seconds |

Valve Control (Pressurization Step and Exhaust Step)

| Deposition Step | 1 second |
| Etching Step | 5 seconds |
| Pressurization Step | 1 second |
| Exhaust Step | 0.5 seconds |

The results illustrated in FIG. 11 indicate that when valve control (pressurization step and exhaust step) is implemented, the selectivity (sel) of the silicon substrate with respect to the resist film may be increased by approximately 6% and the etch rate may be increased by approximately 6% compared to the case where valve control is not implemented (no pressurization step and exhaust step). Also, scallops resulting from switching between the deposition step and the etching step may be reduced and a desirable etching shape may be obtained.

Also, note that in the case where no valve control was implemented (no pressurization step and exhaust step), the plasma process of repeatedly performing a deposition step and an etching step was performed in 7-second cycles with the deposition step being performed for 2 seconds and the etching step being performed for 5 seconds. On the other hand, in the case where valve control (pressurization step and exhaust step) was implemented, the etching step was performed for 5 seconds whereas the deposition step was performed for 1 second. That is, it was revealed that a desirable protective film could be formed even if the process time of the deposition step was reduced to 1 second with respect to a process time of 5 second for the etching step. In this case, the switch time for switching gases was 1 second (pressurization step: 1 second; exhaust step: 0.5 seconds). Based on these experimental results, it can be appreciated that by implementing the pressurization step and the exhaust step in the gas supply system 10 according to the present embodiment, the etching step may be prolonged with respect to the deposition step, and the process time of the etching step may be up to five times the process time of the deposition step.

As described above, in the gas supply system 10 according to the present embodiment, the gas switch time may be reduced by implementing the pressurization step and the exhaust step. Also, the mixing of the gases used in a previous step and a next step may be prevented upon switching. In this way, a protective film with an adequate film thickness may be formed even when the process time of the deposition step is reduced. Thus, the etching time with respect to the deposition time may be prolonged and a hole may be etched deeper. Also, because the etching time with respect to the deposition time may be prolonged, a high etch rate (E/R) may be maintained. Further, the selectivity may be improved, and a desirable etching shape may be obtained. Also, because the duration of the deposition step may be reduced, the cycle of the plasma process of repeatedly performing a deposition step and an etching step may be reduced.

[Overall Configuration of Semiconductor Manufacturing Apparatus]

In the following, an exemplary configuration of a semiconductor manufacturing apparatus 30 using the gas supply system 10 according to the present embodiment is described with reference to FIG. 12.

Figure 12:
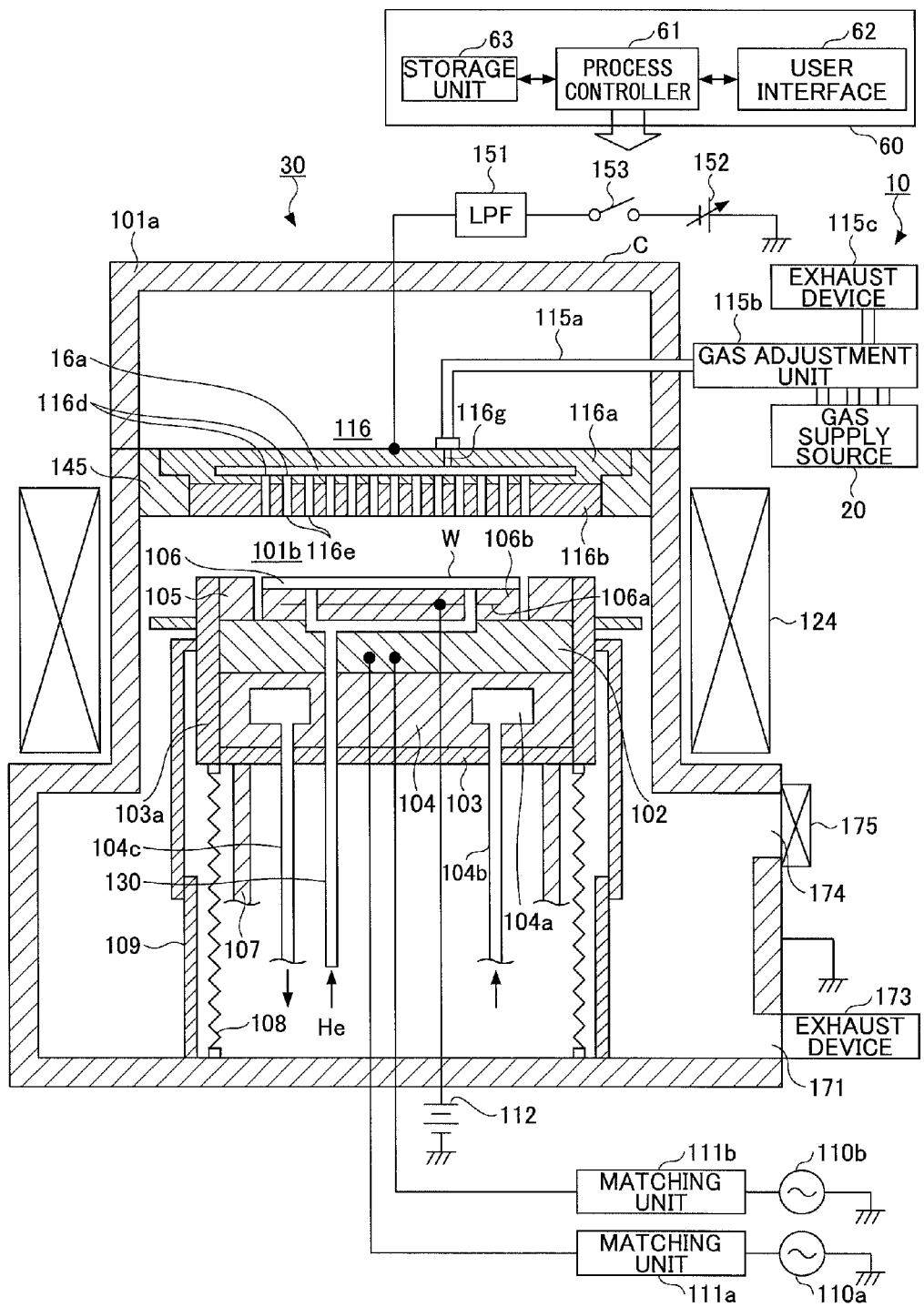
FIG. 12 illustrates a semiconductor manufacturing apparatus that uses the gas supply system according to an embodiment of the present invention.

FIG. 12 schematically illustrates an overall configuration of the semiconductor manufacturing apparatus 30 using the gas supply system 10. The semiconductor manufacturing apparatus 30 includes the chamber C, which is kept airtight and is electrically grounded. The semiconductor manufacturing apparatus 30 is connected to the gas supply system 10 according to the present embodiment outside the chamber C. The gas supply system 10 repeatedly alternates between supplying a deposition main gas and supplying an etching main gas into the chamber C at predetermined switching timings. In this way, the silicon substrate W corresponding to a workpiece may be etched by a plasma generated within the chamber C of the semiconductor manufacturing apparatus 30 in a plasma process of repeatedly performing a deposition step and an etching step, and a deep hole with a desired diameter may be formed on the silicon substrate W.

The chamber C may be cylindrical in shape and may be made of aluminum having an alumite-treated (anodized) surface, for example. A mounting table 102 for holding the silicon substrate W laterally is arranged in the chamber C. The mounting table 102 may be made of aluminum having an alumite-treated (anodized) surface, for example, and may also act as a lower electrode. The mounting table 102 is supported by a conductive support 104 and is movable up and down by an elevating mechanism 107 via an insulating plate 103. The elevating mechanism 107 is arranged in the chamber C and is covered by a bellows 108 made of stainless steel. A bellows cover 109 is arranged at the outer side of the bellows 108. A focus ring 105 made of single crystal silicon, for example, is arranged at an upper side outer periphery of the mounting table 102. Further, a cylindrical inner wall member 103a made of quartz, for example, is arranged to surround the support 104 and the mounting table 102.

A first high frequency power supply 110a is connected to the mounting table 102 via a first matching unit 111a, and the first high frequency power supply 110a is configured to supply a high frequency power of a predetermined frequency (at least 27 MHz; e.g. 40 MHz) for plasma generation. Also, a second high frequency power supply 110b is connected to the mounting table 102 via a second matching unit 111b, and the second high frequency power supply 110b is configured to supply a high frequency power of a predetermined frequency (no more than 13.56 MHz; e.g. 2 MHz) for biasing. Also, the shower head 116 that acts as an upper electrode is arranged above the mounting table 102 to face opposite and parallel to the mounting table 102. The shower head 116 and the mounting table 102 are configured to act as a pair of electrodes.

An electrostatic chuck 106 for electrostatically attracting the silicon substrate W is arranged on an upper surface of the mounting table 102. The electrostatic chuck 106 includes an electrode 106a interposed between an insulator 106b. A DC voltage supply 112 is connected to the electrode 106a, and when a DC voltage from the DC voltage source 112 is applied to the electrode 106a, the silicon substrate W is attracted to the electrostatic chuck 106 by a Coulomb force.

A coolant flow path 104a is formed within the support 104. A coolant inlet pipe 104b and a coolant outlet pipe 104c are connected to the coolant flow path 104a. By circulating a suitable coolant such as cooling water within the coolant flow path 104a, the silicon substrate W may be controlled to a predetermined temperature. Also, a pipe 130 for supplying cold/heat transfer gas (backside gas) such as helium (He) to the backside surface of the silicon substrate W is provided.

The shower head 116 is arranged at a ceiling portion of the chamber C. The shower head 116 includes a main body 116a and a top plate 116b constituting an electrode plate. The shower head 116 is supported on a top part of the chamber C via an insulating member 145. The main body 116a may be made of a conductive material such as aluminum having an alumite-treated (anodized) surface, for example, and is configured to detachably support the top plate 116b thereunder.

The gas diffusion chamber 16a is arranged inside the main body 116a, and a plurality of gas passage holes 116d are formed on a bottom part of the main body 116a at positions below the diffusion chamber 16a. A plurality of gas introducing holes 116e communicating with the gas passage holes 116d are arranged to penetrate through the top plate 116b in the thickness direction of the top plate 116b. With such a configuration, a gas supplied to the diffusion chamber 16a may be showered into a plasma processing space within the chamber C via the gas passage holes 116d and the gas introducing holes 116e. Note that pipes (not shown) for circulating a coolant may be arranged at the main body 116a and the like to cool the shower head 116 and adjust its temperature to a desired temperature.

A gas inlet 116g for introducing a gas into the diffusion chamber 16a is formed at the main body 116a. The gas adjustment unit 115b is connected to the gas inlet 116g via a gas supply pipe 115a.

A variable DC voltage supply 152 is electrically connected to the shower head 116 via a low pass filter (LPF) 151. Power supply operations of the variable DC voltage supply 152 may be turned on/off by an on-off switch 153. The variable DC voltage supply 152 and the on-off switch 153 are controlled by the controller 60. The controller 60 may turn on the on-off switch 153 as is necessary when a high frequency power is applied to the mounting table 102 from the first high frequency power supply 110a and the second high frequency power supply 110b and a plasma is generated in the plasma generation space. In this way, a predetermined DC voltage is applied to the shower head 116.

A cylindrical ground conductor 101a is arranged to extend from a side wall of the chamber C to a position above the height position of the shower head 116. The cylindrical ground conductor 101a includes a top plate arranged at its upper side. An exhaust port 171 is formed at a bottom part of the chamber C. An exhaust device 173 is connected to the exhaust port 171. The exhaust device 173 includes a vacuum pump and is configured to depressurized the interior of the chamber C to a predetermined vacuum level by operating the vacuum pump. Also, a gate valve 175 that may be opened/closed to load/unload the silicon substrate W into/out of the chamber C from a loading port 174 is arranged at a sidewall of the chamber C.

Figure 13:
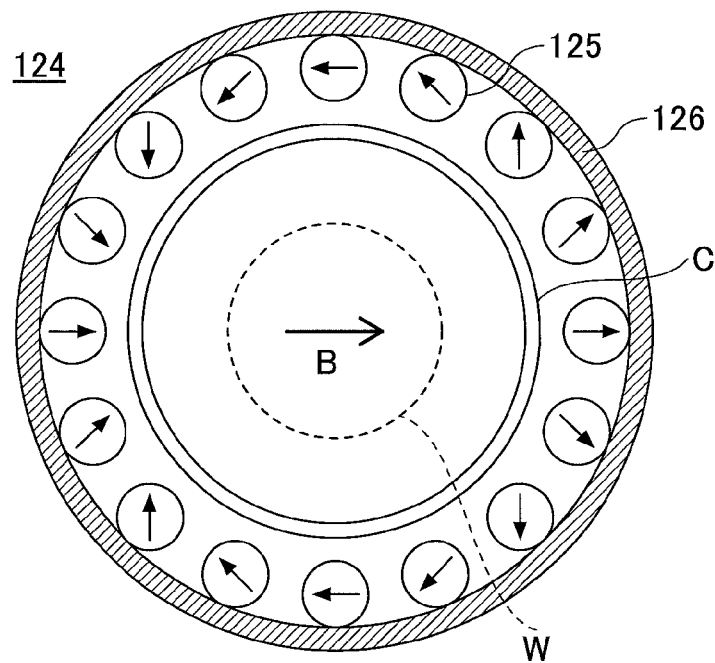
FIG. 13 is a horizontal cross-sectional view of a dipole ring magnet according to an embodiment of the present invention.

A dipole ring magnet 124 is arranged to extend annularly or concentrically around the chamber C and vertically across the position of the mounting table 102 during processing. As illustrated in the cross-sectional view of FIG. 13, the dipole ring magnet 124 includes a ring-shaped casing 126 made of a magnetic material and a plurality of (e.g. 16) columnar anisotropic segment magnets 125 arranged at predetermined intervals in a circumferential direction within the casing 126. In FIG. 13, a uniform horizontal magnetic field B directed in one direction as a whole may be formed by shifting the direction of magnetization of each of the columnar anisotropic segment magnets 125 according to the circumferential direction of the casing 126.

Thus, a RF electric field in the vertical direction may be formed by the first high frequency power supply 110a and the horizontal magnetic field B may be formed by the dipole ring magnet 124 within the space between the mounting table 102 and the showerhead 116. By prompting magnetron discharge using the above orthogonal electromagnetic fields, a plasma may be generated at a high density around the surface of the mounting table 102.

Referring back to FIG. 12, the controller 60 controls the semiconductor manufacturing apparatus 30 according to a recipe. The controller 60 includes a CPU for executing various programs. For example, the controller 60 may include a process controller 61 that controls various units of the semiconductor manufacturing apparatus 30, a user interface 62, and a storage unit 63. The user interface 62 may include a keyboard for inputting operation commands to manage a process manager and/or the semiconductor manufacturing apparatus 30 and a display for visually presenting an operation status of the semiconductor manufacturing apparatus 30, for example.

The storage unit 63 stores various control programs and data to be executed by the semiconductor manufacturing apparatus 30 as recipes. The process controller 61 reads a recipe from the storage unit 63 and executes the recipe in response to a command input from the user interface 62 so that a desired process may be performed on the silicon substrate W within the chamber C. Note that in some embodiments, the recipes may be stored in a computer-readable medium, or may be made available using communication, for example.

APPLICATION EXAMPLE

Note that an etching process for forming a deep hole in the silicon substrate W using the gas supply system 10 according to the present embodiment has been described above as an illustrative example. In the following, an application example of the present embodiment is described with reference to FIG. 14.

Figure 14:
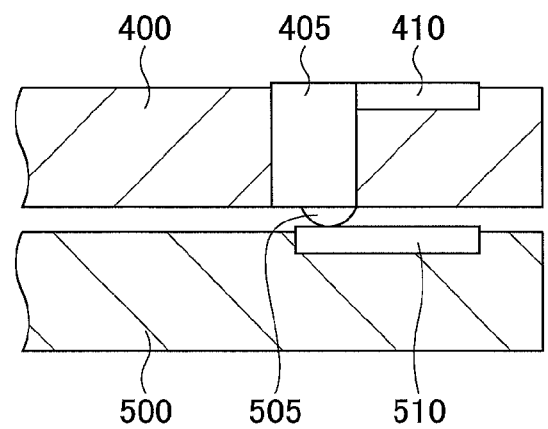
FIG. 14 illustrates an application example of the plasma process of repeatedly performing a deposition step and an etching step according to an embodiment of the present invention.

In the application example, the semiconductor manufacturing apparatus 30 according to the present embodiment is used in 3D circuitization for establishing electrical connection between semiconductor chips stacked on one another using an electrode of a through hole (TSV: through-silicon via) penetrating through a semiconductor chip. In FIG. 14, a through hole (TSV) 405 is formed in an upper semiconductor chip 400. Wiring is passed through the through hole 405 to cause a pad electrode 410 of the upper semiconductor chip 400 and a pad electrode 510 of a lower semiconductor chip 500 to conduct with each other via the through hole 405 and a bump 505.

In the present example, the through hole 405 is formed by the semiconductor manufacturing apparatus 30 using the gas supply system 10 according to the present embodiment. With the present 3D wiring, the through hole 405 may be formed for a TSV having a diameter of 30-50 μm.

In this way, downsizing, high-speed processing, and a reduction in power consumption may be achieved in the electrode of the TSV. Also, by implementing the plasma process of repeatedly performing a deposition step and an etching step and additionally performing a pressurization step and an exhaust step in the manufacturing process of the TSV, the gas switch time may be reduced.

<Concluding Remarks>

Although certain illustrative embodiments of a gas supply method for a semiconductor manufacturing apparatus, a gas supply system, and a semiconductor manufacturing apparatus according to the present invention have been described above with reference to the accompanying drawings, a semiconductor manufacturing apparatus, a gas supply system, and a semiconductor manufacturing apparatus according to the present invention are not limited to these embodiments. That is, various changes and modifications to the above embodiments may readily occur to a person skilled in the art in light of the disclosures made herein, and it is to be understood that such changes and modifications are also included within the scope of the present invention.

For example, in the exhaust step of the present invention, the fifth valve arranged at the exhaust pipe may be opened at timings simultaneous with the start of the etching step and the start of the deposition step, or the fifth valve may be opened immediately before or after the start of the etching step and the start of the deposition step.

Also, the first pressurization step may be executed during or after the immediately preceding deposition step.

Also, in the exhaust step, the fifth valve may be opened at timings simultaneous with the start of the first step and the start of the second step, or timings immediately before or after the start of the first step and the start of the second step, the first step involving performing a plasma process on a workpiece by supplying a first gas into a chamber via the first gas pipe and the diffusion chamber, and the second step involving performing a plasma process on the workpiece by supplying the second gas into the chamber via the second gas pipe and the diffusion chamber.

Also, the first pressurization step may be executed during the immediately preceding second step or after the immediately preceding second step.

Also, the second pressurization step may be executed during the immediately preceding first step or after the immediately preceding first step.

Also, the first step may be a deposition step, and the second step may be an etching step, and the process time of the etching step may be up to five times longer than the process time of the deposition step.

Also, the first gas may include $SiF_4$ gas and $O_2$ gas.

Also, the second gas may include $SF_6$ gas and $O_2$ gas.

Also, the semiconductor manufacturing apparatus according to the present invention is not limited to a capacitively coupled plasma processing apparatus that generates capacitively coupled plasma (CCP) by discharging a high frequency generated between parallel plate electrodes within a chamber. For example, the present invention may be applied to an inductively coupled plasma processing apparatus that generates inductively coupled plasma (ICP) under a high frequency induction field by having an antenna arranged on or near an upper surface of a chamber, or a microwave plasma processing apparatus that generates plasma waves using microwave power, for example.

Also, the workpiece subject to a plasma process in the present invention may be any processing object such as a silicon substrate, a semiconductor wafer, a large substrate for a flat panel display (FPD), an electroluminescence (EL) element, or a substrate for a solar battery, for example.

The present application is based on and claims the benefit of priority of Japanese Patent Application No. 2012-060636 filed on Mar. 16, 2012, the entire contents of which are herein incorporated by reference.

DESCRIPTION OF THE REFERENCE NUMERALS 10 gas supply system
11 first valve
12 second valve
13 third valve
14 fourth valve
15 fifth valve
16a diffusion chamber
20 gas supply source
21, 22 flow control system
30 semiconductor manufacturing apparatus
41 first gas supply pipe
42 first gas introducing pipe
43 second gas supply pipe
44 second gas introducing pipe
45 first bypass pipe
46 second bypass pipe
47 exhaust pipe
60 controller
115b gas adjustment unit
115c exhaust device
F1 first gas supply mechanism
F2 second gas supply mechanism
F3 exhaust mechanism

The invention claimed is:

1. A gas supply method for a semiconductor manufacturing apparatus that alternately repeats a first step of performing a plasma process on a workpiece by supplying a first gas into a chamber via a first gas pipe and a diffusion chamber, and a second step of performing a plasma process on the workpiece by supplying a second gas into the chamber via a second gas supply pipe and the diffusion chamber, the gas supply method comprising the steps of:
controlling communication between the first gas pipe and a diffusion chamber using a first valve;
controlling communication between the second gas pipe and the diffusion chamber using a second valve;

controlling discharge of gas within the first gas pipe using a third valve that is provided to a first bypass pipe connected upstream from the first valve of the first gas pipe;

controlling discharge of gas within the second gas pipe using a fourth valve that is provided to a second bypass pipe connected upstream from the second valve of the second gas pipe;

controlling communication between an exhaust pipe and the diffusion chamber using a fifth valve, said exhaust pipe being not connected to the first gas pipe and said exhaust pipe being not connected to the second gas pipe;

a first pressurization step of closing the first valve and closing the third valve before starting the first step, and increasing a pressure within the first gas pipe by the first gas;

a second pressurization step of closing the second valve and closing the fourth valve before starting the second step, and increasing a pressure within the second gas pipe by the second gas; and an exhaust step of opening the fifth valve in response to a start of the first step and a start of the second step, and discharging gas within the diffusion chamber via the exhaust pipe, wherein one of the first and second gases is switched to the other of the first and second gases when a sum of the number of moles flowing out toward the exhaust pipe and the number of moles flowing out toward the chamber reaches a volume of the diffusion chamber, and the same number of moles of the other of the first and second gasses flows into the diffusion chamber.

2. The gas supply method as claimed in claim 1, wherein the exhaust step includes opening the fifth valve at timings simultaneous with the start of the first step and the start of the second step, immediately before the start of the first step and the start of the second step, or immediately after the start of the first step and the start of the second step.

3. The gas supply method as claimed in claim 1, wherein the first pressurization step is executed during the second step that is executed immediately before the first step, or after the second step that is executed immediately before the first step.

4. The gas supply method as claimed in claim 1, wherein the second pressurization step is executed during the first step that is executed immediately before the second step, or after the first step that is executed immediately before the second step.

5. The gas supply method as claimed in claim 1, wherein the first step includes a deposition step, and the second step includes an etching step; and a process time of the etching step is up to five times a process time of the deposition step.

6. The gas supply method as claimed in claim 1, wherein the first gas includes $SiF_4$ gas and $O_2$ gas.

7. The gas supply method as claimed in claim 1, wherein the second gas includes $SF_6$ gas and $O_2$ gas.

8. The gas supply method as claimed in claim 1, wherein the first bypass pipe includes a first orifice provided at a downstream side of the third valve, and wherein the second bypass pipe includes a second orifice provided at a downstream side of the fourth valve.

9. The gas supply method as claimed in claim 8, wherein the method further includes narrowing the first bypass pipe by the first orifice and avoiding an abrupt pressure change within the first bypass pipe when switching between the first step and the second step, and narrowing the second bypass pipe by the second orifice and avoiding an abrupt pressure change within the second bypass pipe when switching between the first step and the second step.

10. The gas supply method as claimed in claim 9, wherein the exhaust pipe has ½ inch in a diameter and the method further includes closing the fifth valve when the pressure within the exhaust pipe reaches a normal pressure during the exhausting step.

11. The gas supply method as claimed in claim 1, wherein, in the first and second pressurization steps, the pressures within the first and second gas pipes are increased so as to exhaust the diffusion chamber instantly from the exhaust pipe.

* * * * *